United States Patent [19]
Dutta

[11] Patent Number: 5,925,896
[45] Date of Patent: Jul. 20, 1999

[54] SURFACE-EMITTING SEMICONDUCTOR OPTICAL DEVICE

[75] Inventor: Achyut Kumar Dutta, Tokyo, Japan

[73] Assignee: NEC Corporation, Tokyo, Japan

[21] Appl. No.: 08/813,427

[22] Filed: Mar. 10, 1997

[30] Foreign Application Priority Data

Mar. 8, 1996 [JP] Japan .................................. 8-052149

[51] Int. Cl.⁶ .................................................. H01L 27/15
[52] U.S. Cl. .............................. 257/79; 257/86; 257/98; 257/103
[58] Field of Search ................................ 257/79, 86, 84, 257/94, 98, 103

[56] References Cited

U.S. PATENT DOCUMENTS

| | | | |
|---|---|---|---|
| 5,319,219 | 6/1994 | Cheng et al. | 257/94 |
| 5,466,950 | 11/1995 | Sugawara et al. | 257/94 |

FOREIGN PATENT DOCUMENTS 2174272   7/1990   Japan .

OTHER PUBLICATIONS

Hideto Sugawara et al, "High–Efficiency InGaAlP Visible Light–Emitting Diodes", Jpn. J. Appl. Phys. vol. 31 (1992) pp. 2446–2451, Part 1, No. 8, Aug. 1992.

F. A. Kish et al, "Very high–efficiency semiconductor wafer–bonded transparent–substrate ($Al_xGa_{1-x})_{0.5}In_{0.5}P$/GaP light-–emitting diodes", Appl. Phys. Lett. vol. 64, No. 21, May 23 1994, pp. 2839–2841.

Primary Examiner—John Guay
Assistant Examiner—Nat K. Kelley
Attorney, Agent, or Firm—Sughrue, Mion, Zinn, Macpeak & Seas, PLLC

[57] ABSTRACT

A surface-emitting semiconductor optical device is provided, which has a high external quantum efficiency and a high coupling efficiency with an optical fiber. This device has a multilayer device structure including an optical absorption layer formed by a semiconductor substrate, a semiconductor mirror layer, a first (n- or p-type) semiconductor cladding layer, a semiconductor active layer, a second (p- or n-type) semiconductor cladding layer, and a current spreading layer formed by a transparent and doped semiconductor wafer. These layers are stacked along a stacking direction of the device structure. The absorption layer is located at a first end of the body. The active layer is sandwiched between the first and second cladding layers. The mirror layer is located between the first cladding layer and the absorption layer, and serves to reflect the light generated by the active layer toward the current spreading layer. The current spreading layer is located at a second end of the body opposite to the first end. First and second electrodes are formed at the first and second ends of the body, respectively. An exposed surface of the current spreading layer serves as a light-emitting surface.

3 Claims, 17 Drawing Sheets

SURFACE-EMITTING SEMICONDUCTOR OPTICAL DEVICE

BACKGROUND OF THE INVENTION

1. Field of the Invention

The present invention relates to a semiconductor optical device applicable to optical communication systems as a light source and more particularly, to a surface-emitting semiconductor optical device such as a Light-Emitting Diode (LED) that includes a transparent semiconductor wafer as a current spreading layer, and a fabrication method of the device.

2. Description of the Prior Art

A typical semiconductor optical device of this sort is a high-brightness visible LED serving as a light source in the Plastic Optical Fiber (POF)-based optical data link system. This LED may be used as an outdoor display device, an automobile indicator, or a light source in the application fields where an incandescent lamp is usually used.

From the origin of the development of LEDs, lots of research and development have been made for the purpose of improving or enhancing the quantum efficiency of the LED. The internal quantum efficiency of the LED, which is mainly dependent upon the crystal quality, has been able to be achieved up to approximately 100% by using the conventional LED technology.

On the other hand, the external quantum efficiency of the visible LED that has been already achieved is at most approximately 10%. This is mainly due to the inefficient use of the injected current and optical reflection/absorption.

The external quantum efficiency of the LED is dependent on the overall structure of the LED and the shape of an electrode used for spreading the injected current to uniformly flow into the semiconductor p-n junction.

With the conventional surface-emitting LEDs, a thick current spreading layer made of semiconductor is formed on an adjacent cladding layer. The current spreading layer has a function of spreading the injected current through the electrode and of uniformly distributing the injected current into an active layer located on the opposite side to the current spreading layer with respect to the cladding layer. The current spreading layer has a low resistivity for the injected current and a high transmittance for the wavelength of the emitted light.

The injected current will spread within the current spreading layer as the increasing distance from the electrode in a direction perpendicular to the current spreading layer. The spreading range or level of the injected current varies mainly dependent upon the thickness of the current spreading layer. As the thickness of the current spreading layer increases, the injected current is distributed more uniformly, resulting in enhancement of brightness of the LED.

The upper electrode or contact layer needs to be as thin as possible for the purpose of high brightness of the LED.

To decrease the resistivity of the current spreading layer in the conventional surface-emitting LEDs, it is usual that the current spreading layer is heavily doped with a proper dopant. This doping process is typically performed after growing the basic structure of the LED. Any post-growth process such as a high-temperature diffusion process of the dopant may be used to reduce the resistivity.

The formation of the heavily-doped, thick current spreading layer causes several disadvantages stated below.

First, the large thickness of the current spreading layer necessitates the long growth time, which makes the cost of the LED higher.

Second, the heavily doping process of the current spreading layer deteriorates the optical characteristics of the LED. This is caused by the unwanted diffusion of the dopant such as zinc (Zn) into the active layer.

An article, the Japan Journal of Applied Physics, Vol. 31, Part 1, No. 8, August 1992, pp. 2446–2451, disclosed a report about the use of a heavily-doped, thick semiconductor layer as the current spreading layer. The LED reported by this article also has the above first and second problems or disadvantages.

FIG. 1 shows a top view of a typical example of the conventional visible LEDs, and FIG. 2 shows a vertical cross-sectional view thereof along the line II—II in FIG. 1.

As shown in FIG. 1, an n-type GaAs buffer layer 102 is formed on a main surface of an n-type GaAs substrate 1 serving as an optical absorption layer. An n-type $(Al_xGa_{1-x})_zIn_{1-z}P$ cladding layer 104 is formed on the n-type GaAs buffer layer 102. A Quantum-Well (QW) active layer 105 is formed on the n-type cladding layer 104. A p-type $(Al_xGa_{1-x})_{0.5}In_{0.5}P$ cladding layer 106 is formed on the active layer 105.

An $Al_{0.7}Ga_{0.3}As$ current spreading layer 129 is formed on the p-type cladding layer 106. A p-type GaAs cap layer 130 is formed on the top surface 129a of the current spreading layer 129. The cap layer 130 is contacted with the central area of the top surface 129a. An upper (or, p-side) electrode 131 is formed on the p-type cap layer 130.

A lower (or, n-side) electrode or contact layer 109 is formed on an opposite main surface of the substrate or absorption layer 101 to the buffer layer 102. The lower electrode 109 is entirely contacted with the opposite main surface of the substrate 101.

The exposed top surface 129a of the current spreading layer 129 from the upper electrode 131 serves as an emitting surface from which visible light 132 is emitted.

With the conventional LED shown in FIGS. 1 and 2, the thickness of the current spreading layer 129 also affects the brightness of the emitted light 132, because the optical intensity of the emitted light 132 is directly proportional to the current density on the emitting surface 129a.

The intensity of the emitted light 132 is highest in the vicinity around the upper electrode 131, and it decreases as the lateral distance from the electrode 131 increases. This is because the injected current tends to concentrate at the central region just beneath the electrode 131 within the current spreading layer 129.

The use of the thicker current spreading layer 129 will increase the uniformity of the injected current distribution and the emitted light 132.

FIG. 3 shows the relationship of the light intensity with the position on the emitting surface 129a. When the current spreading layer 129 is comparatively thin, the light intensity varies along the curve 134. This means that the intensity will decrease drastically as the distance from the electrode 131 increases.

On the other hand, when the current spreading layer 129 is comparatively thick, the light intensity varies along the curve 135. This means that the intensity will decrease slightly or gradually as the distance from the electrode 131 increases.

Conventionally, a thick semiconductor substrate transparent to the emitted light 132 has been used with the wafer bonding technology.

An article, the Applied Physics Letters, Vol. 64, No. 21, May 1994, pp. 2839–2841, disclosed a report on the enhancement of the external quantum efficiency of the visible LED with the use of a GaP wafer. In this report, a GaAs wafer or substrate serving as an optical absorption layer is etched away and then, the GaP wafer is bonded thereto.

In this LED structure, since the process of etching off the GaAs substrate is required prior to the bonding process, the bonding reproducibility will degrade, resulting in various difficulties in a lot of wafer processes. This leads to fabrication cost increase of the LED.

A large number of articles and Japanese patent publications on visible LEDs (wavelength: 570 nm to 670 nm) based on III–V compound semiconductors were disclosed, in which various LED structures were discussed for enhancement of the external quantum efficiency.

The Japanese Non-Examined Patent Publication No. 2-174272, which was published in 1990, disclosed a high-brightness visible LED. In this publication, the brightness of the LED is enhanced by employing an n-p-n-p structure located under a contact layer, thereby facilitating the spreading of the injected current toward outside the contact layer.

The conventional LED disclosed in the Japanese Non-Examined Patent Publication No. 2-174272 has the following drawback:

Prior to the process of making the contact layer, a mesa structure needs to be formed to reach the underlying active region in the light emitting surface, thereby making a current path. Further, a proper dopant such as zinc is necessary to be diffused in a high-temperature atmosphere. Therefore, the performance of the LED is degraded by the high-temperature heat-treatment for Zn-diffusion, which is due to the deterioration of the active region.

Also, since the light emitting surface contains the heavily-doped dopant, a large part of the emitted light may be absorbed in the diffused layer, which is dependent on the energy of the light.

Further, this conventional LED needs to be fabricated through various processes and therefore, the fabrication cost will be higher.

Additionally, it is difficult to enable the high speed operation because of high parasitic capacitance induced by the wide contact area.

With the above conventional LEDs, the optical output and the coupling efficiency are not high enough for the short-distance data linking systems, especially for the POF-based data linking systems. This is because the conventional LEDs have a low output power and low coupling efficiency with the POF.

SUMMARY OF THE INVENTION

Accordingly, an object of the present invention is to provide a surface-emitting semiconductor optical device having a satisfactorily-high external quantum efficiency, and a fabrication method of the device.

Another object of the present invention is to provide a surface-emitting semiconductor optical device having a satisfactorily-high coupling efficiency with an optical fiber, and a fabrication method of the device.

Still another object of the present invention is to provide a surface-emitting semiconductor optical device that is able to be readily fabricated in mass scale, and a fabrication method of the device.

The above objects together with others not specifically mentioned will become clear to those skilled in the art from the following description.

According to a first aspect of the present invention, a surface-emitting semiconductor optical device is provided, which has a multilayer device structure.

The multilayer device structure includes an optical absorption layer formed by a semiconductor substrate, a semiconductor mirror layer, a first (n- or p-type) semiconductor cladding layer, a semiconductor active layer, a second (p- or n-type) semiconductor cladding layer, and a current spreading layer formed by a semiconductor wafer.

The absorption layer, the mirror layer, the first cladding layer, the active layer, the second cladding layer, and the current spreading layer are stacked along a stacking direction of the multilayer device structure.

The absorption layer is located at a first end of the body.

The active layer is sandwiched between the first and second cladding layers, and serves to generate light.

The mirror layer is located between the absorption layer and the first cladding layer, and serves to reflect the light generated by the active layer toward the current spreading layer.

The current spreading layer is located at a second end of the body opposite to the first end. The current spreading layer is transparent with respect to the light generated by the active layer, and is doped with a dopant to decrease its electric resistance.

A first electrode is formed at the first end of the body, and is electrically connected to the absorption layer.

A second electrode is formed at the second end of the body, and is electrically connected to the current spreading layer.

An exposed surface of the current spreading layer serves as a light-emitting surface.

A driving current is injected into the body to flow through the absorption layer, the mirror layer, the first cladding layer, the active layer, the second cladding layer, and the current spreading layer along the stacking direction of the body.

The light generated by the active layer is emitted from the body through the light-emitting surface of the current spreading layer.

With the surface-emitting semiconductor optical device according to the first aspect, since the current spreading layer is formed by the transparent and doped semiconductor wafer, the distribution of the injected current readily tends to be uniform. Therefore, no degradation of the external quantum efficiency occurs due to the dopant diffusion into the active layer during the fabrication process sequence of the device.

Further, since the mirror layer is located between the absorption layer and the first cladding layer, the light generated by the active layer is effectively reflected by the mirror layer toward the current spreading layer (i.e., the light-emitting surface) within the multilayer device structure. Thus, even the light propagating in an opposite direction to the light-emitting surface within the device structure is emitted from the light-emitting surface. Accordingly, the external quantum efficiency is improved or enhanced.

As a result, the external quantum efficiency is able to be satisfactorily high, realizing a high output power.

Additionally, the thickness of the absorption layer and/or the current spreading layer may be adjusted by mechanical polishing or the like, before forming the first and/or second electrode. Thus, the total height of the body is variable as necessary, enabling the selection of Numerical Aperture (NA). As a result, the coupling efficiency with an optical fiber is readily optimized or maximized, which makes the coupling efficiency satisfactorily high.

The current spreading layer is formed by the transparent and doped semiconductor wafer and therefore, no long crystal growth process is required for the current spreading layer. Consequently, the device is able to be readily fabricated in mass scale.

In a preferred embodiment of the device according to the first aspect, a passivation layer is provided to cover the light-emitting surface.

In another preferred embodiment of the device according to the first aspect, the semiconductor wafer is made of a III–V compound semiconductor or a II–VI compound semiconductor.

In still another preferred embodiment of the device according to the first aspect, a semiconductor protection layer is provided for the second cladding layer between the second cladding layer and the current spreading layer.

According to a second aspect of the present invention, a fabrication method of the surface-emitting semiconductor optical device according to the first aspect is provided, which includes the following steps.

(a) A semiconductor substrate is prepared to form an optical absorption layer.

(b) A semiconductor layered structure is formed on the absorption layer. The layered structure includes a semiconductor mirror layer, a first semiconductor cladding layer, a semiconductor active layer, and a second semiconductor cladding layer.

The mirror layer, the first cladding layer, the active layer, and the second cladding layer are stacked on the absorption layer along a stacking direction of the layered structure.

The active layer is sandwiched between the first and second cladding layers, and serves to generate light.

The mirror layer is located between the absorption layer and the second cladding layer, and serves to reflect the light generated by the active layer.

(c) On the other hand, a semiconductor wafer is prepared to form a current spreading layer.

(d) The wafer is bonded directly or indirectly through a semiconductor layer to the opposing second cladding layer. Thus, a multilayer device structure including the absorption layer, the mirror layer, the first cladding layer, the active layer, the second cladding layer, and the current spreading layer is constituted.

The absorption layer is located at a first end of the device structure. The current spreading layer is located at a second end of the device structure opposite to the first end. The current spreading layer is transparent with respect to the light generated by the active layer, and is doped with a dopant to decrease its electric resistance.

(e) A first electrode is formed at the first end of the device structure, and is electrically connected to the absorption layer.

(f) A second electrode is formed at the second end of the device structure, and is electrically connected to the current spreading layer.

An exposed surface of the current spreading layer serves as a light-emitting surface.

A driving current is injected into the device structure to flow through the absorption layer, the mirror layer, the first cladding layer, the active layer, the second cladding layer, and the current spreading layer along the stacking direction of the device structure.

The light generated by the active layer is emitted from the body through the light-emitting surface of the current spreading layer.

With the fabrication method of the surface-emitting semiconductor optical device according to the second aspect, after a semiconductor layered structure is formed on an absorption layer, a semiconductor wafer is prepared to form a current spreading layer Then, the wafer is bonded directly or indirectly through a semiconductor layer to the opposing second cladding layer, thereby constituting a multilayer device structure.

A first electrode is formed at the first end of the multilayer device structure, and is electrically connected to the absorption layer. A second electrode is formed at the second end of the device structure, and is electrically connected to the current spreading layer.

An exposed surface of the current spreading layer serves as a light-emitting surface.

A driving current is injected into the multilayer device structure through the first and second electrodes, and light is emitted from the exposed surface of the wafer.

In a preferred embodiment of the method according to the second aspect, a step of forming a passivation layer to cover the light-emitting surface is added.

In another preferred embodiment of the method according to the second aspect, the semiconductor wafer is made of a III–V compound semiconductor or a II–VI compound semiconductor.

In still another preferred embodiment of the method according to the second aspect, a step of forming a semiconductor protection layer on the exposed surface of the second cladding layer or the current spreading layer is added.

In a further preferred embodiment of the method according to the second aspect, a step of forming first and second semiconductor protection layers on the exposed surfaces of the second cladding layer and the wafer is added. The first and second protection layers are then combined together.

According to a third aspect of the present invention, another fabrication method of the surface-emitting semiconductor optical device according to the first aspect is provided, which includes the following steps.

(a) A semiconductor wafer is prepared to form a current spreading layer.

(b) A semiconductor layered structure is formed on the current spreading layer. The layered structure includes a first semiconductor cladding layer, a semiconductor active layer, and a second semiconductor cladding layer.

The first cladding layer, the active layer, and the second cladding layer are stacked on the current spreading layer along a stacking direction of the layered structure.

The active layer is sandwiched between the first and second cladding layers, and serves to generate light.

(c) On the other hand, a semiconductor substrate is prepared to form an optical absorption layer.

(d) A mirror layer is formed on the substrate. The mirror layer serves to reflect the light generated by the active layer.

(e) The second cladding layer on the wafer is bonded directly or indirectly through a semiconductor layer to the opposing mirror layer on the substrate. Thus, a multilayer device structure including the current spreading layer, the first cladding layer, the active layer, the second cladding layer, the mirror layer, and the absorption layer is constituted.

The current spreading layer is located at a first end of the device structure. The current spreading layer is transparent with respect to the light generated by the active layer, and is doped with a dopant to decrease its electric resistance. The absorption layer is located at a second end of the device structure opposite to the first end.

(f) A first electrode is formed at the first end of the device structure, and is electrically connected to the current spreading layer.

(g) A second electrode is formed at the second end of the device structure, and is electrically connected to the absorption layer.

An exposed surface of the current spreading layer serves as a light-emitting surface.

A driving current is injected into the body to flow through the current spreading layer, the first cladding layer, the active layer, the second cladding layer, the mirror layer, and the absorption layer along the stacking direction of the multilayer device structure.

The light generated by the active layer is emitted from the body through the light-emitting surface of the current spreading layer.

The fabrication method of the surface-emitting semiconductor optical device according to the third aspect substantially corresponds to one obtained by replacing the absorption layer with the current spreading layer and vice versa in the second aspect. Therefore, the device according to the first aspect can be fabricated.

In a preferred embodiment of the method according to the third aspect, a step of forming a passivation layer to cover the light-emitting surface is added.

In another preferred embodiment of the method according to the third aspect, the semiconductor wafer is made of a III–V compound semiconductor or a II–VI compound semiconductor.

In still another preferred embodiment of the method according to the third aspect, a step of forming a semiconductor protection layer on the exposed surface of the mirror layer or the second cladding layer is added.

In a further preferred embodiment of the method according to the third aspect, a step of forming first and second semiconductor protection layers on the exposed surfaces of the mirror layer and the second cladding layer is added. The first and second protection layers are then combined together.

BRIEF DESCRIPTION OF THE DRAWINGS

In order that the present invention maybe readily carried into effect, it will now be described with reference to the accompanying drawings.

DETAILED DESCRIPTION OF THE PREFERRED EMBODIMENTS

Figure 1:
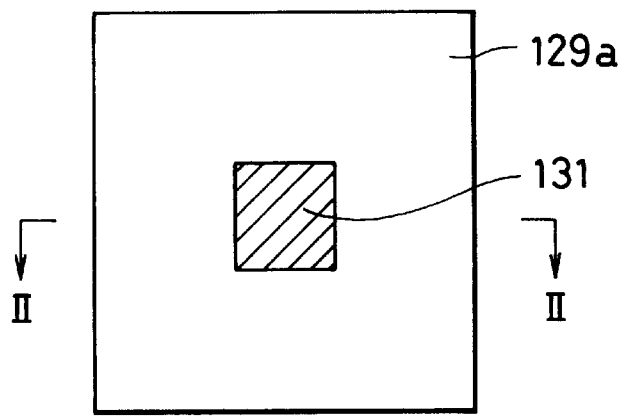
FIG. 1 is a top view of a typical example of the conventional visible LEDs.
Figure 2:
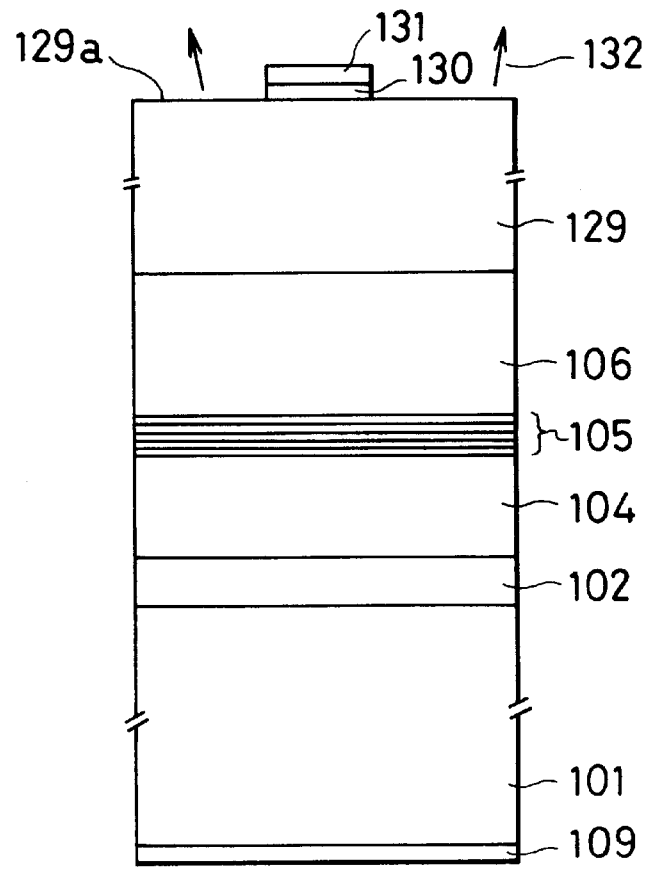
FIG. 2 is a vertical cross-sectional view along the, line II—II in FIG. 1.
Figure 3:
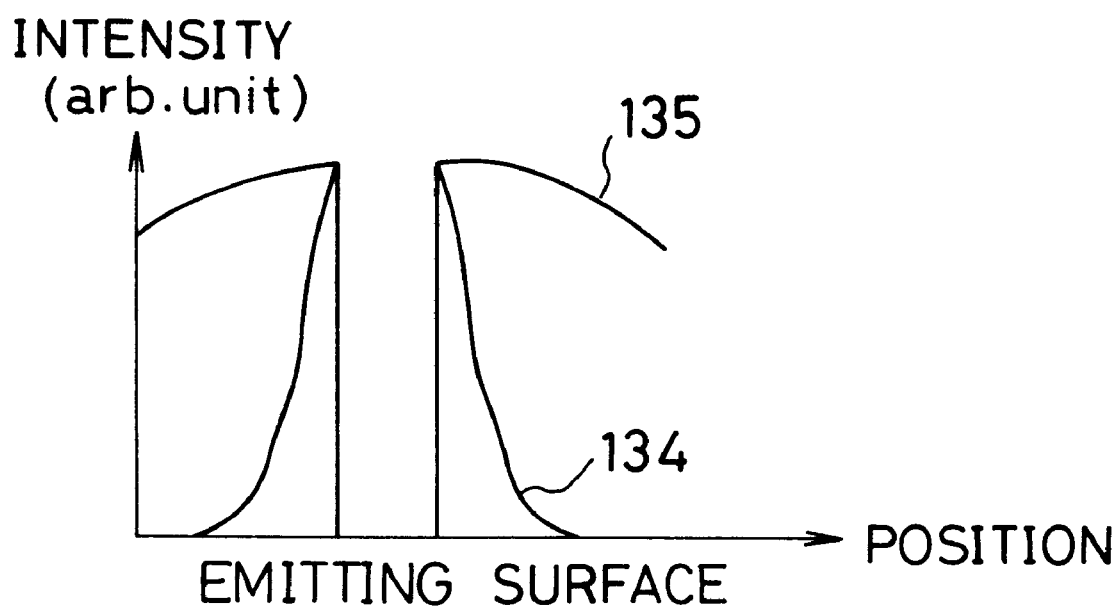
FIG. 3 is a diagram showing the relationship of the light intensity with the position on the emitting surface.
Figure 3:
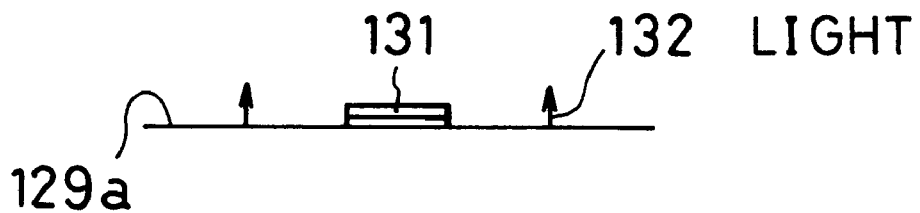

Preferred embodiments of the present invention will be described below referring to the drawings attached.

FIRST EMBODIMENT

Figure 4:
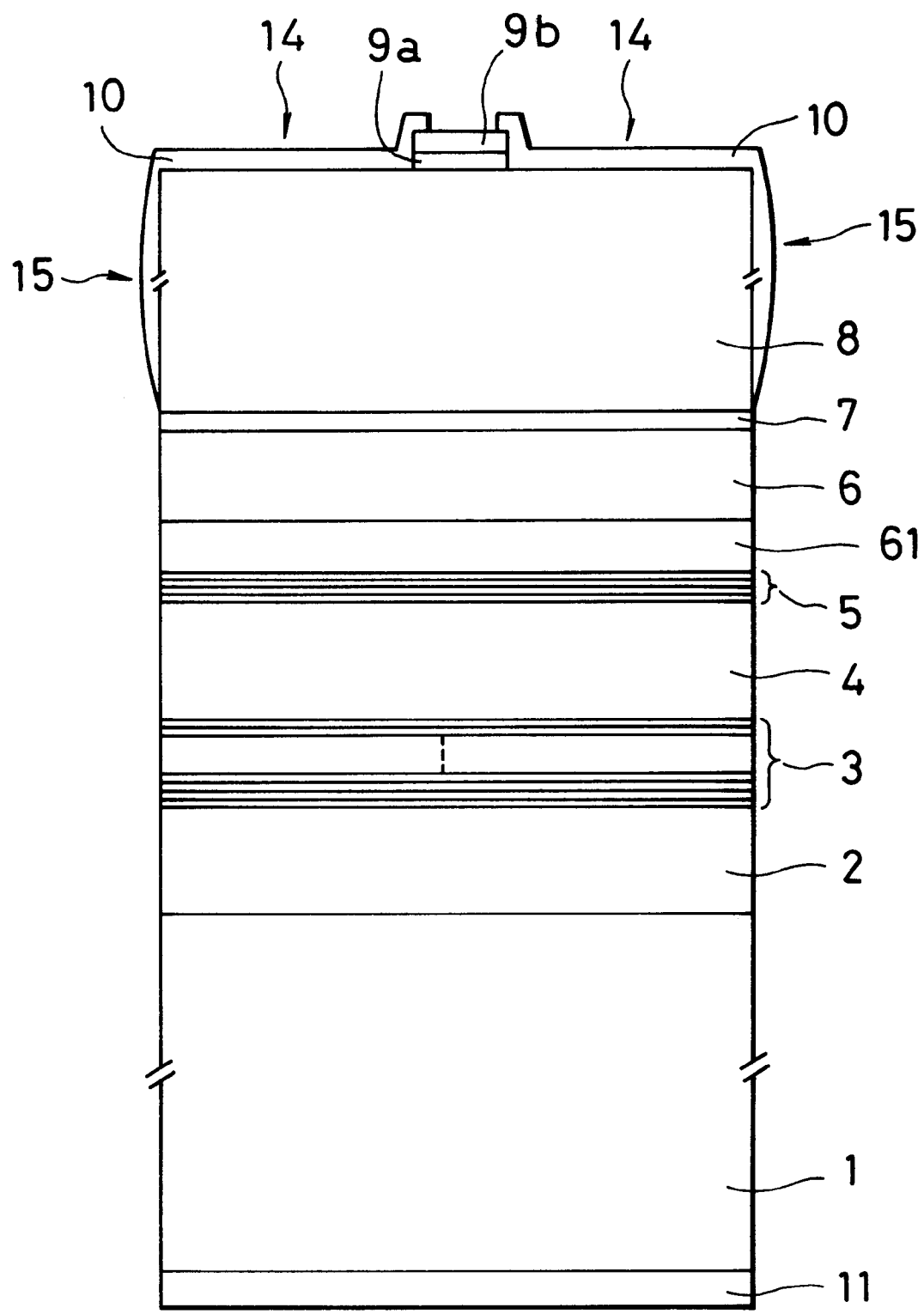
FIG. 4 is a vertical cross-sectional view of a surface-emitting semiconductor optical device according to a first embodiment.

A surface-emitting visible LED according to a first embodiment of the present invention is shown in FIG. 4.

As shown in FIG. 4, an n-type GaAs buffer layer 2 is formed on a main surface of an n-type GaAs substrate 1. The substrate 1 serves as an optical absorption layer.

An n-type mirror layer 3 serving as a DBR is formed on the buffer layer 2. The mirror layer 3 has a multilayer structure made of a first plurality of semiconductor sublayers and a second plurality of semiconductor sublayers, which are alternately stacked in a direction perpendicular to the layer 3. The first plurality of sublayers have a large difference in refractive index from the second plurality of sublayers.

Each of the sublayers of the mirror layer 3 may have a thickness of ($\lambda/4$), where $\lambda$ is the wavelength of the visible light to be emitted.

For example, for an AlGaInP active layer that emits light with a wavelength of 590 to 700 nm, the mirror layer 3 maybe formed by the combination of fifteen $Al_{0.5}Ga_{0.5}As$ sublayers and fifteen AlAs sublayers that are alternately stacked. In this case, the obtainable reflectance is 90% or higher.

To realize the reflectance of 99.9% for the light with a wavelength of 650 nm, the mirror layer 3 may be formed by the following combinations:

(a) twenty pairs of AlAs sublayers and $Al_{0.5}Ga_{0.5}As$ sublayers (b) fifteen pairs of $Al_{0.5}Ga_{0.5}As$ sublayers and $(Al_{0.5}Ga_{0.5}As)_{0.5}In_{0.5}P$ sublayers (c) twenty five pairs of $Al_{0.5}In_{0.5}P$ sublayers and $(Ga_{0.5}In_{0.5}P)$ sublayers (d) fifteen pairs of AlAs sublayers and GaAs sublayers The super-lattice structure with a low refractive index is able to provide a high reflectance with respect to visible light and a wide stop band of 100 nm or wider. Therefore, such the super-lattice structure is preferable used for the mirror layer 3.

For example, an $Al_xGa_{1-x}P$ super-lattice structure may be used, which is formed by AlP sublayers and GaP sublayers.

On the mirror layer 3, an n-type $(Al_xGa_{1-x})_{0.5}In_{0.5}P$ cladding layer 4 is formed, where x is in the range from 0.1 to 0.3.

An undoped Quantum Well (QW) active layer 5 is formed on the n-type cladding layer 4. The active layer 5 has a multilayer structure made of a first plurality of sublayers and a second plurality of sublayers, which are alternately stacked in a direction perpendicular to the layer 5.

It is needless to say that the active layer 5 maybe formed by a bulk semiconductor layer or a semiconductor layer with a Multiple Quantum Well (MQW) structure.

A p-type $(Al_xGa_{1-x})_{0.5}In_{0.5}P$ spacer layer 61 is formed on the active layer 5. A p-type $(Al_xGa_{1-x})_{0.5}In_{0.5}P$ cladding layer 6 is formed on the spacer layer 61. An undoped $(Al_xGa_{1-x})_{0.5}In_{0.5}P$ protection layer 7 is formed on the p-type cladding layer 6, where x is in the range from 0.1 to 0.3.

A p-type GaP wafer 8, which is transparent to the light with a wavelength of 0.565 to 0.65 μm, is mechanically bonded onto the protection layer 7. The wafer 8 serves as a current spreading layer. A lower main surface of the wafer 8 is contacted with the underlying protection layer 7.

The substrate or optical absorption layer 1, the buffer layer 2, the mirror layer 3, the n-type cladding layer 4, the active layer 5, the spacer layer 61, the p-type cladding layer 6, the protection layer 7, and the wafer or current spreading layer constitute a semiconductor body.

A p-type GaAs cap layer 9a is formed on an upper main surface of the p-type GaP wafer 8. The cap layer 9a has a circular shape and is located in the central area of the upper main surface of the wafer 8.

An upper or p-side electrode 9b is formed on the cap layer 9a The electrode 9b has the same circular shape and the same size as those of the cap layer 9a. The electrode 9b is not contacted with the upper main surface of the wafer 8.

The upper main surface of the wafer 8 is exposed from the cap layer 9a and the upper electrode 9b at the central area. The exposed main surface of the wafer serves as a circular-ringed light-emitting area 14. The exposed side surface of the wafer 8 serves as a cylindrical light-emitting area 15.

A passivation layer 10 is formed to cover the exposed upper main and side surfaces of the wafer 8. The top of the upper electrode 9b is selectively exposed from the passivation layer 10.

A lower or n-side electrode (or, contact layer) 11 is formed on the bottom or opposite main surface of the substrate 1. The electrode 11 entirely covers this bottom main surface.

Next, a fabrication method of the LED according to the first embodiment of FIG. 4 is explained below with reference to FIGS. 5A to 5D.

First, the n-type GaAs substrate 1 serving as the optical absorption layer is prepared.

Figure 5A:
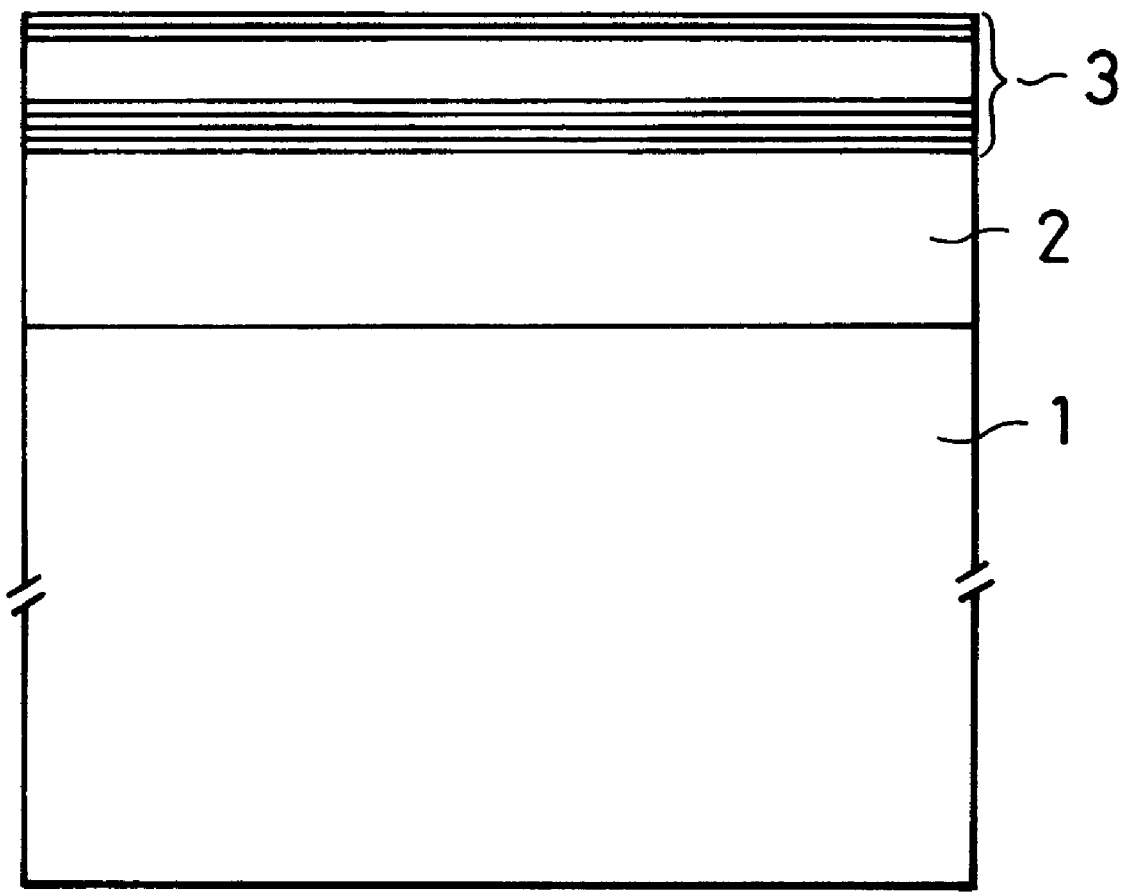
FIGS. 5A to 5D are vertical cross-sectional views of the device according to the first embodiment, which show its fabrication process sequence, respectively.

Then, to prevent the dislocation from occurring due to the lattice mismatch between the substrate 1 and the active layer 3, the n-type GaAs buffer layer 2 is grown on the main surface of the n-type GaAs substrate 1 by a known epitaxial growth process The n-type mirror layer 3 is grown on the buffer layer 2 thus grown by a known epitaxial growth process. The state at this stage is shown in FIG. 5A.

Figure 5B:
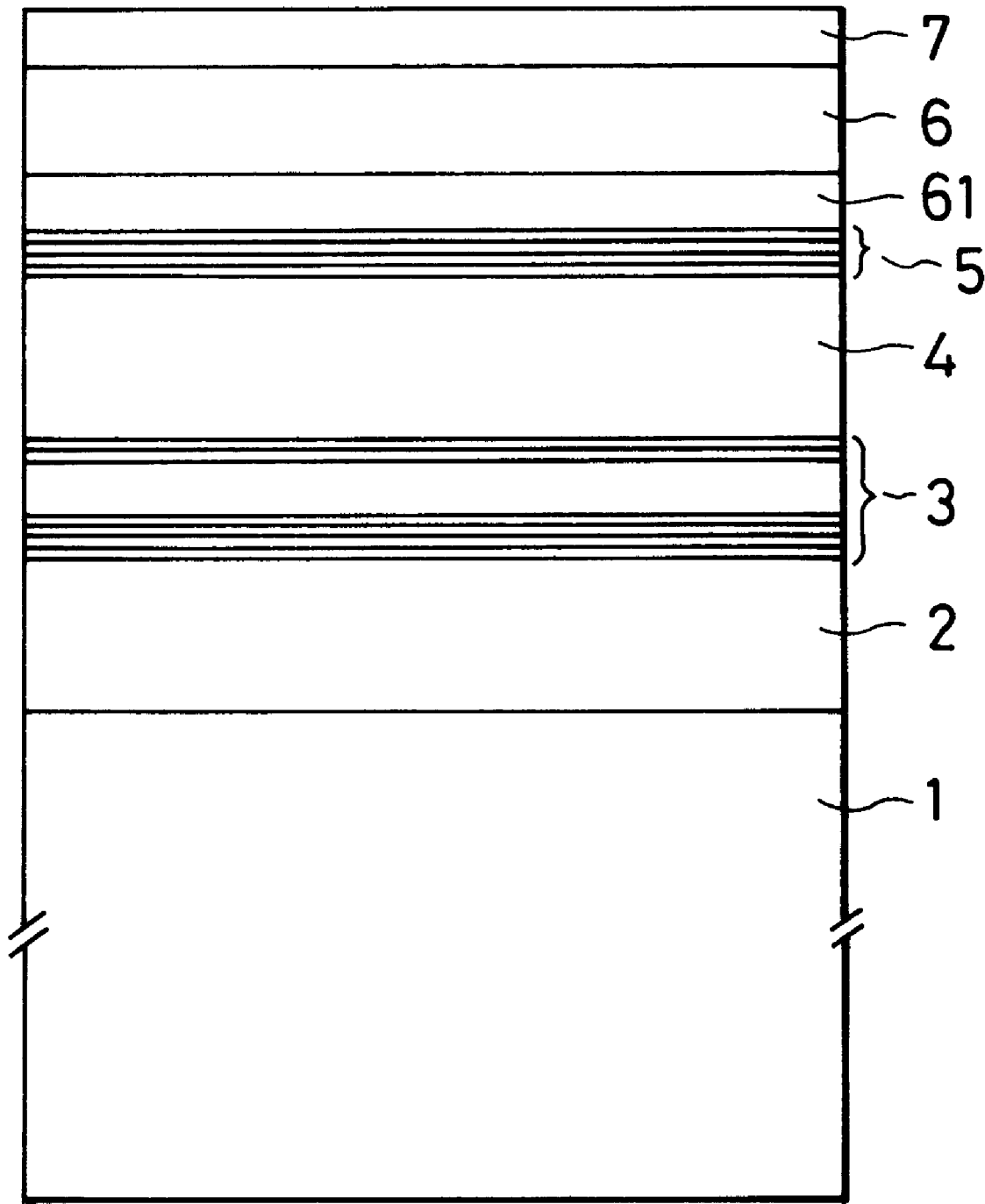

Subsequently, the n-type $(Al_xGa_{1-x})_{0.5}In_{0.5}P$ cladding layer 4 is grown on the DBR mirror layer 3 by a known epitaxial growth process, where x is in the range from 0.1 to 0.3, as shown in FIG. 5B.

The undoped QW active layer 5 is then grown by a known epitaxial growth process on the n-type cladding layer 4 thus grown.

Further, the p-type $(Al_xGa_{1-x})_{0.5}In_{0.5}P$ spacer layer 61 is grown by a known epitaxial growth process on the active layer 5 thus grown. The spacer layer 61 serves to prevent the dopant doped in the overlying p-type cladding layer 6 from diffusing into the underlying active layer 5 during a subsequent process of mechanically bonding the GaP wafer 8 to the protection layer 7.

The p-type $(Al_xGa_{1-x})_{0.5}In_{0.5}P$ cladding layer 6 is then grown by a known epitaxial growth process on the spacer layer 61 thus grown.

The undoped $(Al_xGa_{1-x})_{0.5}In_{0.5}P$ protection layer 7 is grown by a known epitaxial growth process on the p-type cladding layer 6 thus grown. The protection layer 7 serves to prevent aluminum (Al) contained in the p-type cladding layer 6 from being oxidized during the subsequent bonding process of the GaP wafer 8. The state at this stage is shown in FIG. 5C.

As the above epitaxial growth processes for the layers 2, 3, 4, 5, 61, 6, and 7, any method such as Molecular Beam Epitaxy (MBE) can be used.

Figure 5C:
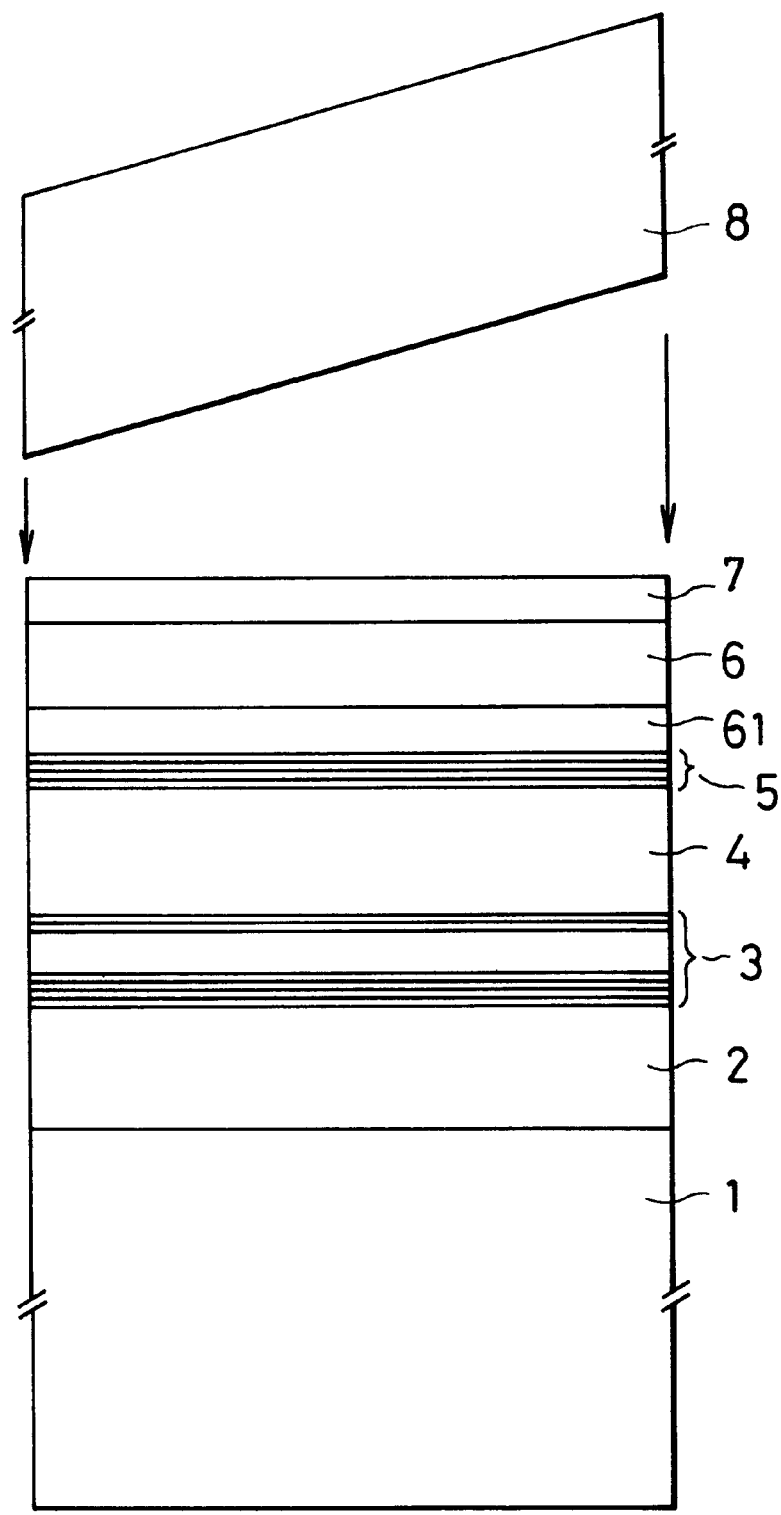
Figure 5D:
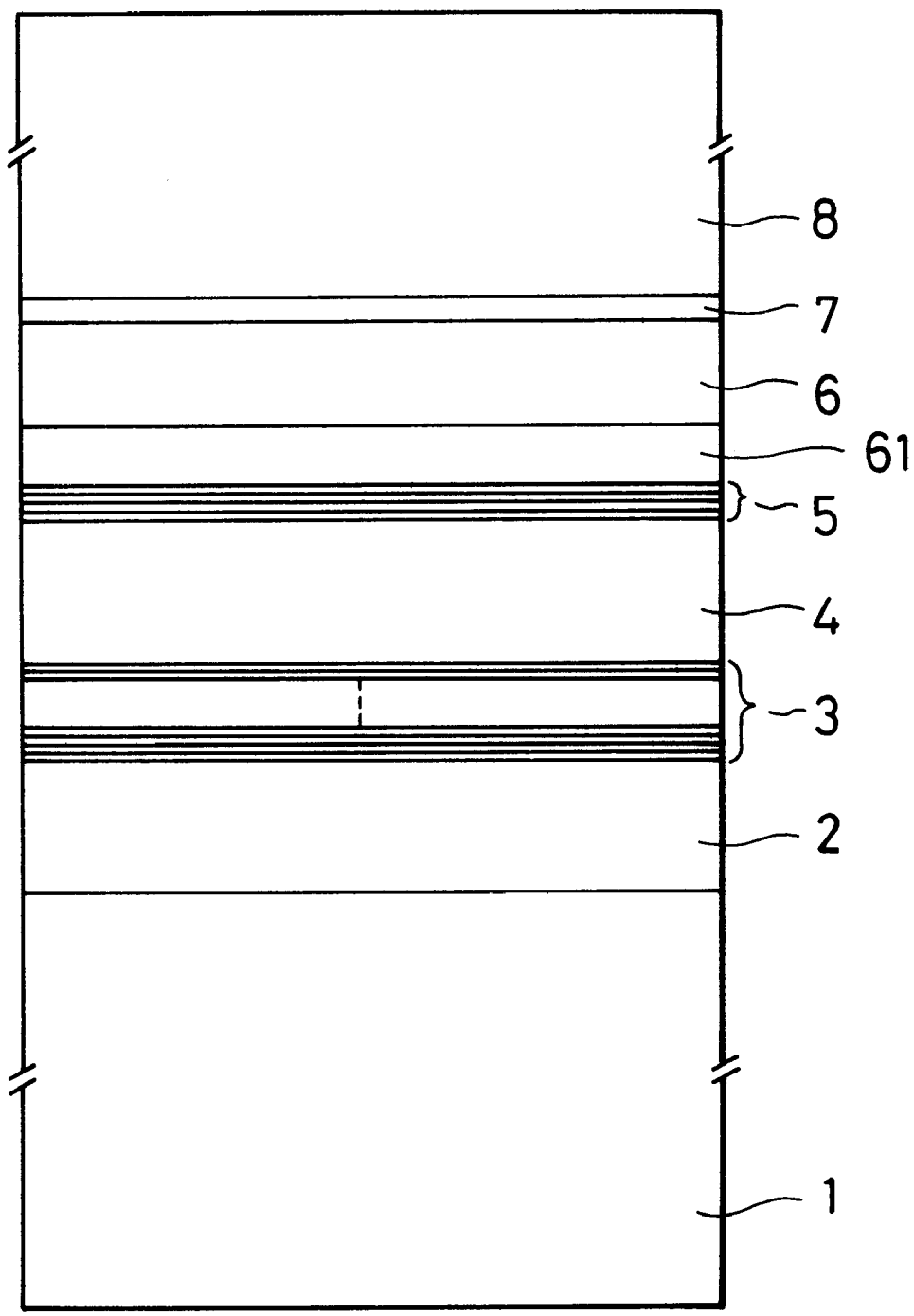

Following this, the p-type GaP wafer 8 serving as a current spreading layer is mechanically bonded onto the protection layer 7, as shown in FIG. 5C. Thus, the lower main surface of the wafer 8 is contacted with and mechanically connected to the upper surface of the protection layer 7, as shown in FIG. 5D.

The bonding process is performed in an nitrogen ($N_2$) atmosphere. The ambient temperature is 750° C. or lower and the necessary bonding time is one hour or less. However, any other known process may be used if it is capable of bonding of the wafer 8 to the p-type cladding layer 6 through the protection layer 7.

The protection layer 7 made of undoped $(Al_xGa_{1-x})_{0.5}In_{0.5}P$ serves to prevent Aluminum in the p-type $(Al_xGa_{1-x})_{0.5}In_{0.5}P$ cladding layer 6 from being oxidized during this bonding process.

Due to the existence of aluminum in the protection layer 7, the bonding of the wafer 8 can be made at a comparatively low temperature such as 600° C. in this first embodiment. If the protection layer 7 contains no aluminum, in other words, if the layer 7 is made of, for example, $Ga_{0.5}In_{0.5}P$, the necessary bonding temperature will be higher. For example, the temperature of 700° C. will be necessary.

During the bonding process of the wafer 8 at a high temperature, the dopant in the wafer 8 tends to diffuse into the active layer 5, resulting in deterioration of the LED characteristics. In this first embodiment, the spacer layer 61 is formed between the active layer 5 and the p-type cladding layer 6, and therefore, such the dopant diffusion will not occur.

As the material of the spacer layer 61, a same-kind material as that of the underlying p-type cladding layer 6, which is made of a lightly-doped, p-type semiconductor material, is preferably used.

Subsequently, as shown in FIG. 4, the p-type GaAs cap layer 9a with the circular shape is selectively grown by a known epitaxial growth process on the upper main surface of the p-type GaP wafer 8. The layer 9a is located on the central area of the upper main surface of the wafer 8.

The upper electrode 9b is selectively formed on the cap layer 9a by the combination of a known metallization process such as sputtering or evaporation and a lift-off or ion-milling process. The electrode 9b has the same shape and the same size as those of the cap layer 9a.

The typical current density in the LEDs is higher than that in the other semiconductor optical devices such as laser diodes (LDs). Therefore, the contact resistance of the LED, which is mainly induced by the p-type electrode 9b, should be limited to approximately 1Ω or less for the purpose of highly reliable operation for sufficient long time.

To cope with this requirement, a metal capable of reliable prevention of the spike in the GaAs cap layer 9a is used as the material of the p-type electrode 9b.

For example, an alloy of gold (Au) and zinc (Zn) (i.e., Au:Zn), or of Au and beryllium (Be) (i.e., Au:Be) may be preferably used.

Further, a combination of Au and nickel (Ni) sublayers (i.e., Au/Ni); of Au and chromium (Cr) sublayers (i.e., Au/Cr); of Au, platinum (Pt), and titanium (Ti) sublayers (i.e., Au/Pt/Ti); of Al-Au alloy, tungsten (w), titanium nitride (TiN)-Au-Zn alloy sublayers (Al:Au/W/TiN:Au:Zn) may be preferably used.

After the formation process of the upper electrode 9b, the passivation layer 10 is deposited by a Chemical Vapor Deposition (CVD) process on the exposed upper main and side surfaces of the wafer 8. Thus, the exposed surface of the wafer 8 is protected.

As the material of the passivation layer 10, alumina ($Al_2O_3$), silicon dioxide ($S_1O_2$), silicon nitride ($SiN_x$), or silicon oxynitride ($SiO_xN_{1-x}$) is typically used. The deposition temperature of the layer 10 is preferably 200° C. or lower.

The passivation layer 10 serves to prevent water molecules or oxygen existing in the ambient of the LED from being absorbed into the light-emitting surfaces 14 and 15, thereby improving the operation reliability of the LED.

Since the GaP wafer B is thick, the passivation layer 10 covers not only the exposed upper main surface of the wafer but also the exposed side surface thereof.

The large thickness of the wafer 8 has a function of preventing the optical reflection at the light-emitting surfaces 14 and 15 due to the refractive index difference between the semiconductor material forming the wafer 8 and the atmospheric air. In consideration with the step coverage of the upper electrode 9b, to maximize the transmittance of the emitted light from the light-emitting surfaces 14 and 15, the thickness of the wafer 8 is preferably set as $[(2n+1)/4]\lambda$, where $\lambda$ is the wavelength of the light, to be emitted from this LED and n is an integer.

After the formation of the passivation layer 10, the bottom or lower main surface of the substrate 1 is mechanically polished by a known polishing process until the substrate 1 has a wanted thickness.

Finally, the lower or n-side electrode (or contact layer) 11 is formed on the lower main surface of the substrate 1 by a known metallization process such as sputtering or evaporation. The electrode 11 covers the entire lower main surface of the substrate 1.

As the material of the electrode 11, for example, the combination of an alloy of Au and germanium (Ge) (i.e., Au:Ge alloy), Ni, and Au sublayers (i.e., Au:Ge/Ni/Au) may be preferably used.

The operation of the surface-emitting visible LED according to the first embodiment of FIG. 4 is as follows:

A specific dc voltage is applied across the upper and lower electrodes 9b and 11, thereby injecting an electric current into the LED. Then, the active layer 5 generates specific visible light due to the injected driving current. The visible light thus generated is emitted through the light-emitting surfaces 14 and 15 from the LED.

With the surface-emitting visible LED according to the first embodiment of FIG. 4, since the current spreading layer is formed by the transparent and doped semiconductor wafer 8, the distribution of the injected current is made uniform. Therefore, no degradation of the external quantum efficiency occurs due to the dopant diffusion into the active layer 5 during the fabrication process sequence of this LED.

Further, the mirror layer 3 serving as a DBR is located between the absorption layer (or, substrate) 1 and the active layer 5. Therefore, the visible light propagated toward substrate 1 within the semiconductor body is effectively reflected by the mirror layer 3 toward the current spreading layer 8 (i.e., the light-emitting surfaces 14 and 15). Thus, even the light propagating in an opposite direction to the light-emitting surfaces 14 and 15 within the body is emitted from the surfaces 14 and 15. Accordingly, the external quantum efficiency is improved or enhanced.

As a result, the external quantum efficiency is able to be satisfactorily high. This leads to a high output power of the LED.

Additionally, the thickness of the absorption layer or the substrate 1 may be adjusted by mechanical polishing or the like, before forming the lower electrode 11. Thus, the total height of the semiconductor body or the LED itself is variable as necessary, enabling the selection of Numerical Aperture (NA).

As a result, the coupling efficiency with an optical fiber is readily optimized or maximized, which makes the coupling efficiency satisfactorily high.

The current spreading layer is formed by the transparent and doped semiconductor wafer 8 and therefore, no long crystal growth process is required for the current spreading layer. Consequently, this LED is able to be readily fabricated in mass scale.

SECOND EMBODIMENT

Figure 6:
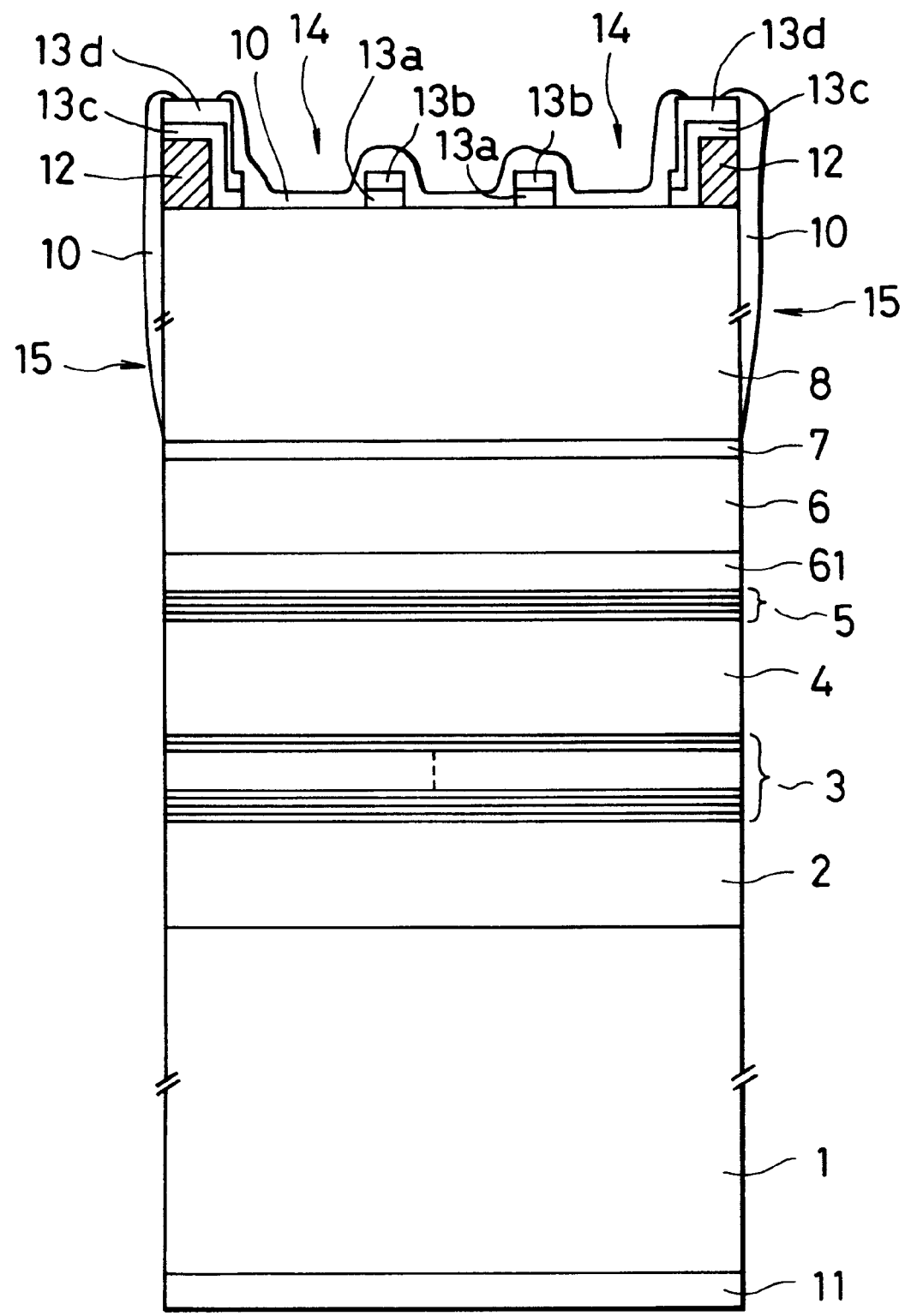
FIG. 6 is a vertical cross-sectional view of a surface-emitting semiconductor optical device according to a second embodiment.

FIG. 6 shows a surface-emitting visible LED according to a second embodiment, which is the same in configuration as that of the first embodiment except for the structure relating to the upper electrode. Therefore, the explanation relating to the same configuration is omitted here by adding the same reference numerals to the corresponding elements in FIG. 6 for the sake of simplification.

Unlike the first embodiment, as shown in FIG. 6, ring-shaped cap layers 13a and 13c, ring-shaped upper (or, p-side) electrodes 13b and 13d, and a ring-shaped silicon dioxide ($SiO_2$) layer 12 are formed on the upper main surface of the GaP wafer 8.

The inner cap layer 13a is located at the central area of the upper surface of the wafer 8. The inner, upper electrode 13b is located on the inner cap layer 13a.

The $SiO_2$ layer 12 is located at the ring-shaped peripheral area of the upper surface of the wafer 8. Between the $SiO_2$ layer 12 and the inner, upper electrode 13b, the surface of the wafer 8 is exposed.

The outer cap layer 13c is formed to cover the top face and inner side face of the $SiO_2$ layer 12. The inner end of the cap layer 13c is contacted with the upper surface of the wafer 8. The outer, upper electrode 13d is located on the outer cap layer 13c.

The exposed upper surface of the wafer 8 is covered with the passivation layer 10. The top of the outer electrode 13d is selectively exposed from the passivation layer 10 for electric connection.

The inner electrode 13b is electrically connected to the outer electrode 13d through a connection line (not shown). Therefore, the driving current is injected into the wafer 8 through the inner and outer electrodes 13b and 13d. In this case, there arises an additional advantage that the injected current tends to have a uniform distribution within the wafer 8 more readily than the case of the first embodiment, together with the same advantages as those in the first embodiment.

On the other hand, in the second embodiment, the contact area of the cap layers 13a and 13c with the wafer 8 is wider than that of the first embodiment and therefore, the parasitic capacitance will be greater than that of the first embodiment. The parasitic capacitance should be as low as possible for the purpose of high-speed operation in optical data-linking system applications. The $SiO_2$ layer 12 has a function of decreasing the contact area of the upper electrodes 13b and 13d with the wafer 8, thereby decreasing the parasitic capacitance.

The $SiO_2$ layer 12 is selectively deposited on the upper surface of the wafer 8 by a CVD process or the like prior to the process of forming the cap layers 13a and 13c. The other processes are the same as those of the first embodiment and therefore, no explanation is shown here.

THIRD EMBODIMENT

Figure 7:
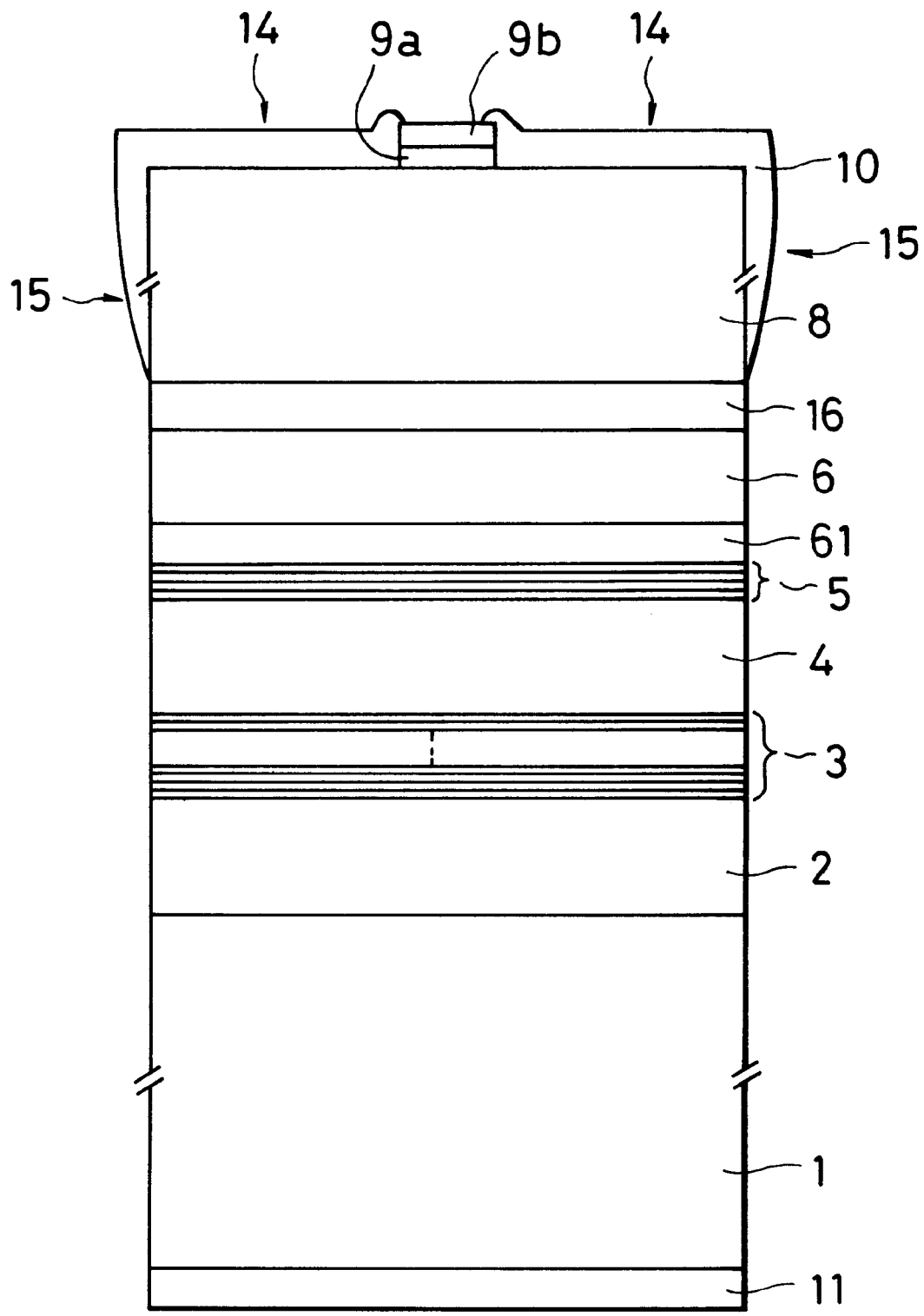
FIG. 7 is a vertical cross-sectional view of a surface-emitting semiconductor optical device according to a third embodiment.
Figure 8:
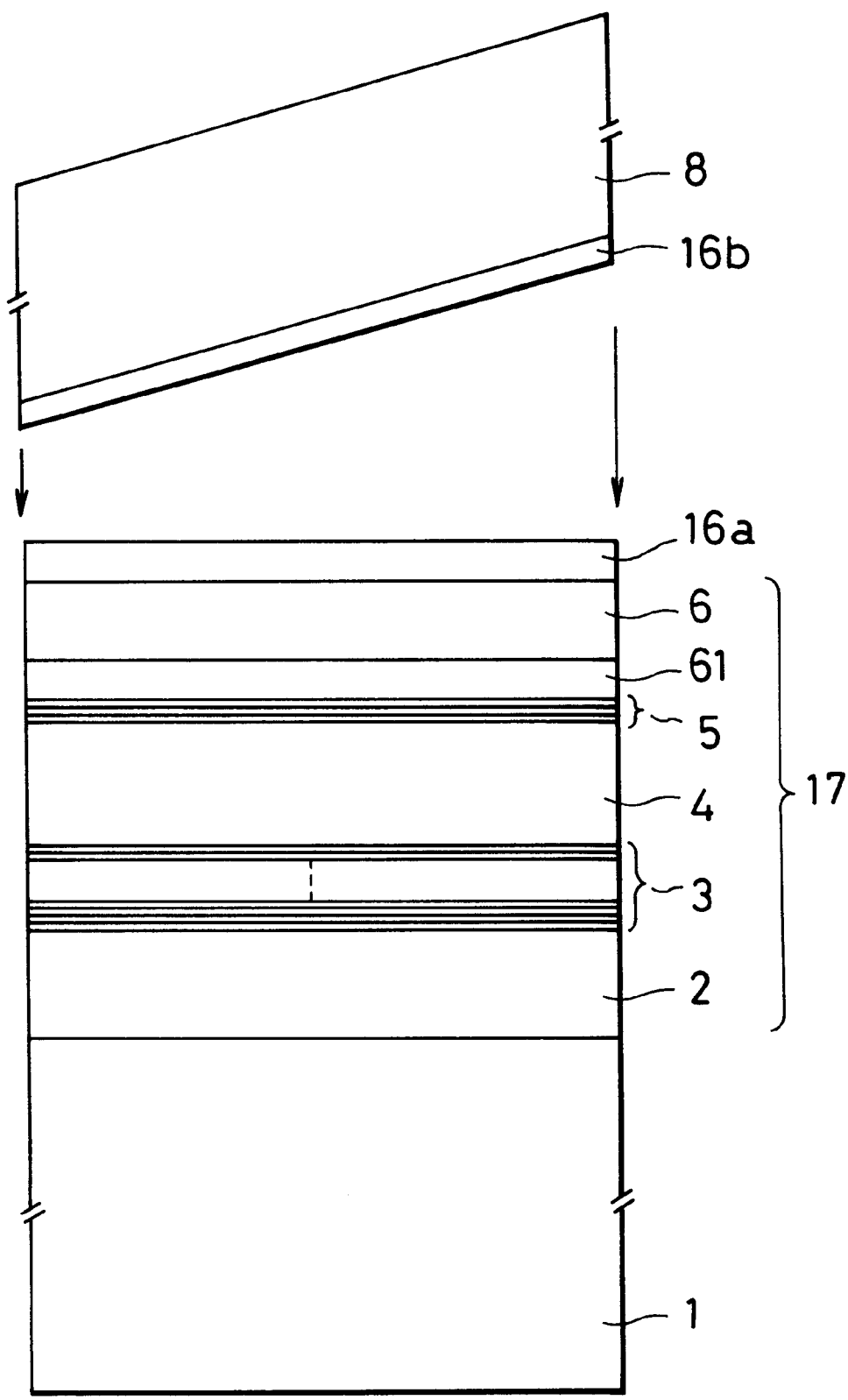
FIG. 8 is a vertical cross-sectional view of the device according to the third embodiment, which shows its fabrication process step.

FIGS. 7 and 8 show a surface-emitting visible LED according to a third embodiment, which is the same in configuration as that of the first embodiment except for the structure relating to the connection part with the wafer 8. Therefore, the explanation relating to the same configuration is omitted here by adding the same reference numerals to the corresponding elements in FIG. 7 for the sake of simplification.

Instead of the undoped $(Al_xGa_{1-x})_{0.5}In_{0.5}P$ protection layer 7 in the first embodiment, a protection layer 16 made of $In_xGa_{1-x}P$ having an energy bandgap of 2.18 to 2.25 eV is formed on the p-type cladding layer 6. The protection layer 16 serves to prevent the p-type cladding layer 6 from being oxidized during the subsequent bonding process of the wafer 8, thereby decreasing the electric resistance of the body.

The surface-emitting LED according to the third embodiment is fabricated in the following way.

First, as shown in FIG. 8, the buffer layer 2, the mirror layer 3, the n-type cladding layer 4, the active layer 5, the spacer layer 61, and the p-type cladding layer 6 are successively grown on the substrate 1 in the same process steps. Thus, a layered structure 17 is formed on the substrate 1.

Next, an $In_xGa_{1-x}P$ protection layer 16a is grown on the p-type cladding layer 6 by a known epitaxial growth process.

On the other hand, another $In_xGa_{1-x}P$ protection layer 16b is grown on the lower surface of the p-type GaP wafer 8 by a known epitaxial growth process. The state at this stage is shown in FIG. 8.

Subsequently, the $In_xGa_{1-x}P$ protection layers 16a and 16b are mechanically bonded to each other. Thus, the two layers 16a and 16b are combined together, thereby forming the $In_xGa_{1-x}P$ protection layer 16 shown in FIG. 7.

This bonding process of the wafer 8 may be performed by the same process as that of the first embodiment.

The subsequent processes to the bonding process are the same as those in the first embodiment and therefore, the explanation for these processes is omitted here for simplification.

In the third embodiment, GaP is used for the wafer 8 serving as the current spreading layer. However, any other wafer such as ZnSe, SiC, CdS, or ZnTe may be used. In this case, there arises an additional advantage that no dislocations due to the lattice mismatch will occur, which decreases the resistance of the LED and enhance the reliability thereof.

FOURTH EMBODIMENT

Figure 9:
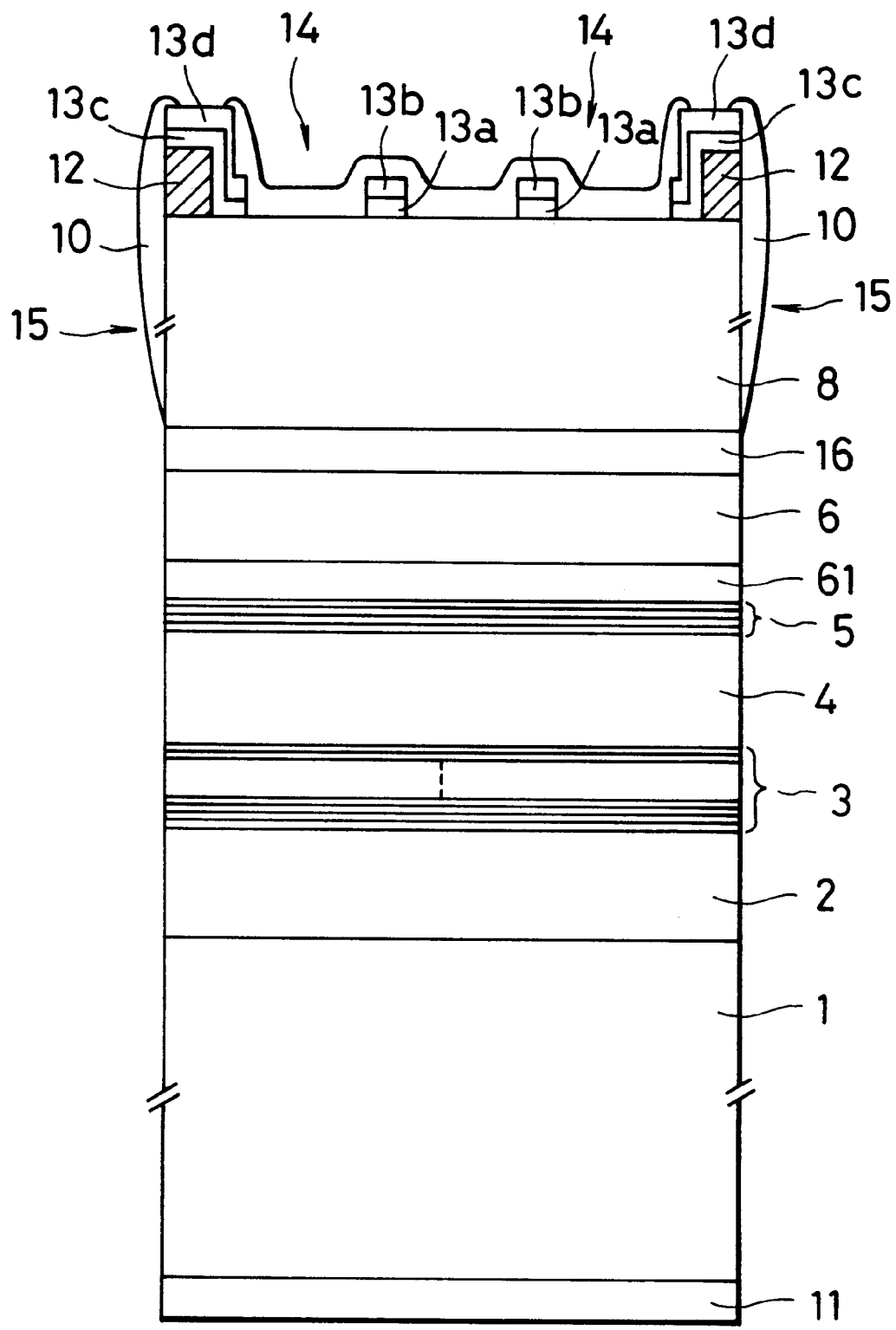
FIG. 9 is a vertical cross-sectional view of a surface-emitting semiconductor optical device according to a fourth embodiment.

FIG. 9 shows a surface-emitting visible LED according to a fourth embodiment, which correspond to one obtained by replacing the upper electrode structure with that of the second embodiment of FIG. 6 in the LED according to the third embodiment of FIG. 7.

Therefore, no explanation relating to the configuration is stated here by adding the same reference numerals to the corresponding elements in FIG. 9 for the sake of simplification.

FIFTH EMBODIMENT

Figure 10:
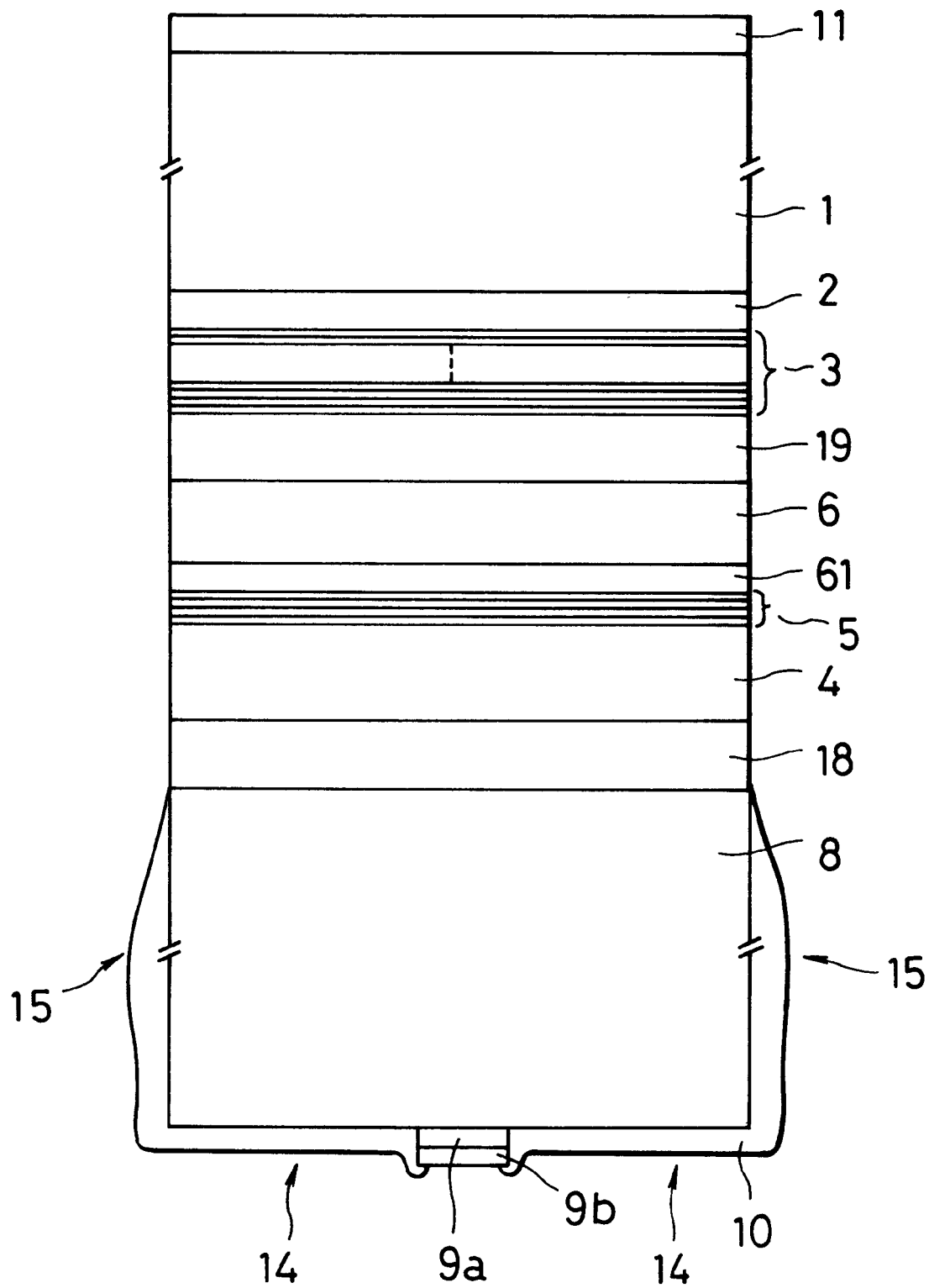
FIG. 10 is a vertical cross-sectional view of a surface-emitting semiconductor optical device according to a fifth embodiment.

FIG. 10 shows a surface-emitting visible LED according to a fifth embodiment.

In the previously-described LEDs according to the first to fourth embodiments, various semiconductor layers are epitaxially grown on the GaAs substrate 1 serving as the optical absorption layer and then, the GaP wafer 8 is mechanically bonded thereto. However, in the fifth embodiment, various semiconductor layers are epitaxially grown on the GaP wafer 8 and then, the GaAs substrate 1 is mechanically bonded thereto.

The bonding process of the substrate 1 may be performed by the same process as that of the first embodiment.

The LED according to the fifth embodiment is fabricated in the following way.

Figure 11A:
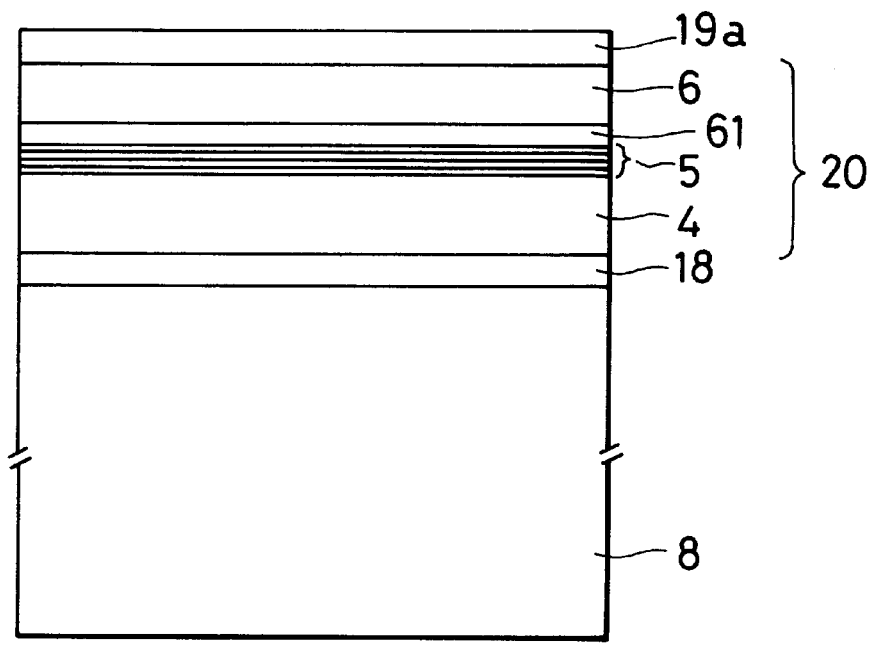
FIGS. 11A to 11D are vertical cross-sectional views of the device according to the fifth embodiment, which show its fabrication process sequence, respectively.

First, to avoid the dislocation due to the lattice mismatch, a p-type $Al_xGa_{1-x}P$ buffer layer 18 with a thickness of 20 nm is epitaxially grown on the p-type GaP wafer 8, as shown in FIG. 11A. Next, the n-type $(Al_xGa_{1-x})_{0.5}In_{0.5}P$ cladding layer 4 is grown on the buffer layer 18 by a known epitaxial growth process.

Subsequently, the undoped QW active layer 5 is epitaxially grown on the p-type cladding layer 4. The p-type $(Al_xGa_{1-x})_{0.5}In_{0.5}P$ spacer layer 61 is grown by a known epitaxial growth process on the active layer 5. The p-type $(Al_xGa_{1-x})_{0.5}In_{0.5}P$ cladding layer 6 is then grown by a known epitaxial growth process on the spacer layer 61. Thus, a layered structure 20 is formed, as shown in FIG. 11A.

Further, an $In_xGa_{1-x}P$ protection layer 19a is grown on the p-type cladding layer 6 by a known epitaxial growth process. The state at this stage is shown in FIG. 11A.

Figure 11B:
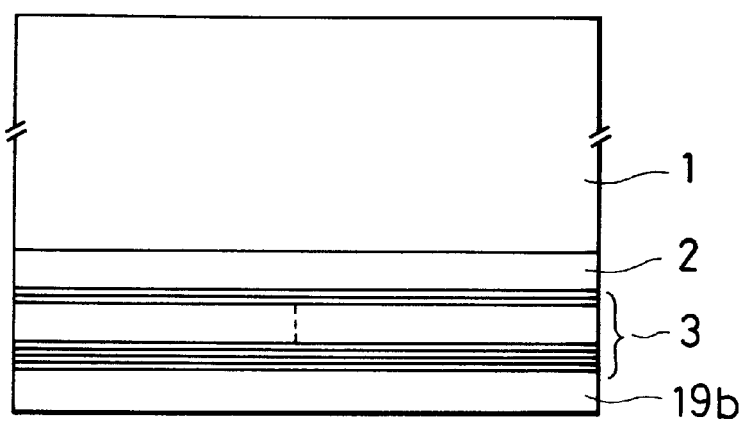

On the other hand, on the main surface of the n-type GaAs substrate 1, the n-type GaAs buffer layer 2, and the mirror layer 3 are successively grown known epitaxial growth processes, as shown in FIG. 11B. Further, another $In_xGa_{1-x}P$ protection layer 19b is grown by a known epitaxial growth process on the mirror layer 3.

Figure 11C:
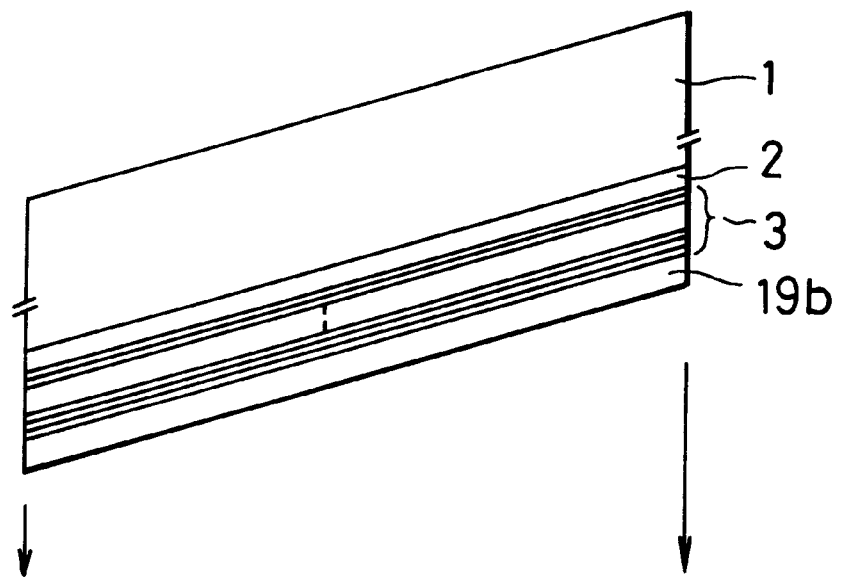
Figure 11C:
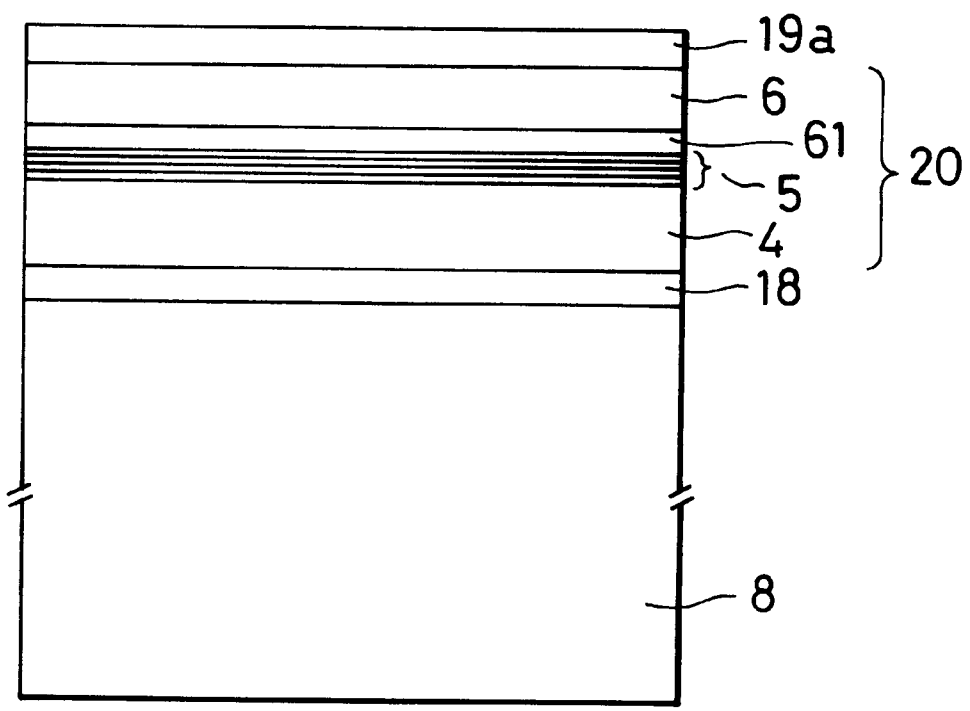
Figure 11D:
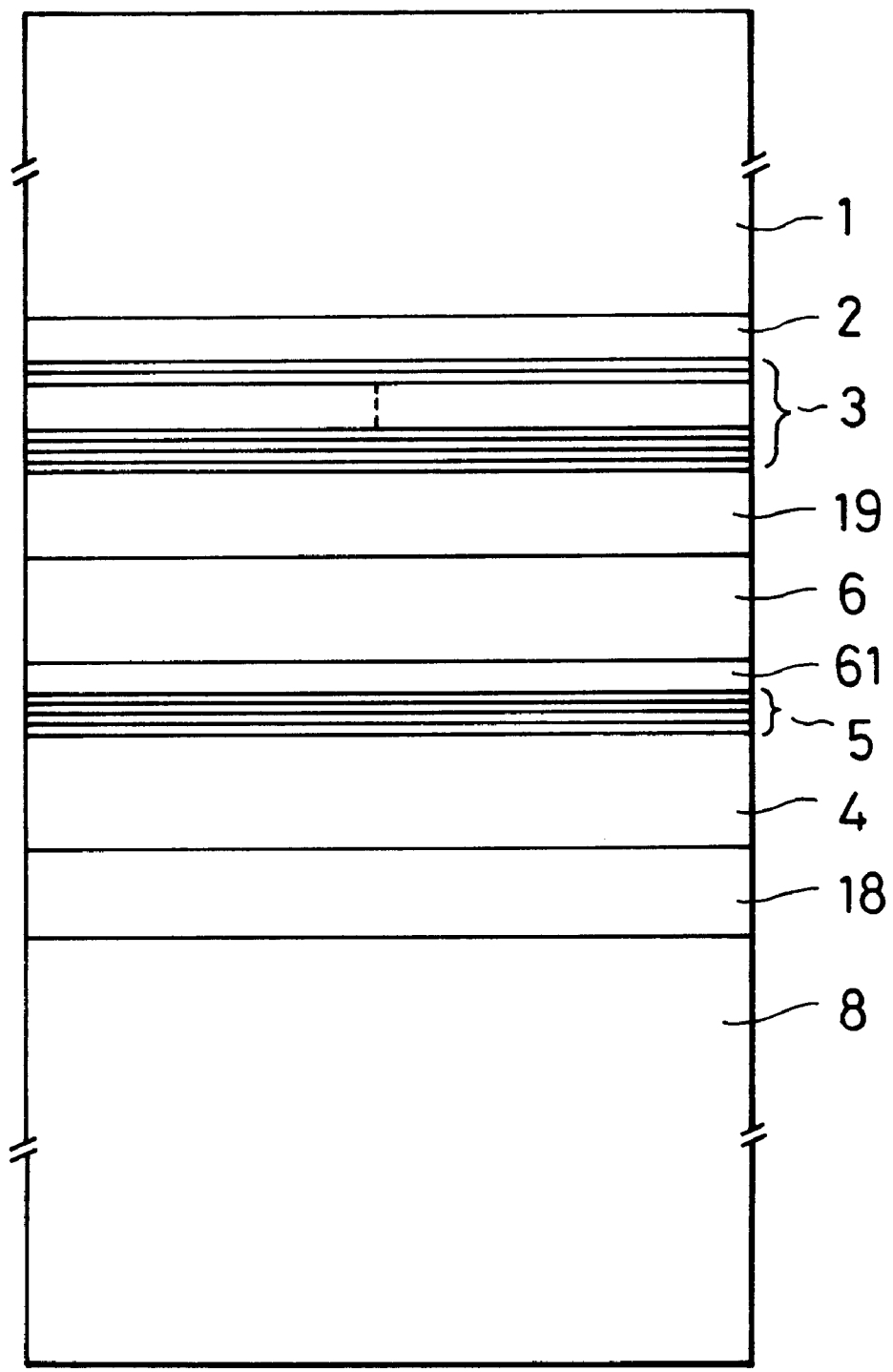

Following this, the $In_xGa_{1-x}P$ protection layers 19a and 19b are mechanically bonded to each other, as shown in FIG. 11C. Thus, these two protection layers 19a and 19b are combined together, thereby forming the $In_xGa_{1-x}P$ protection layer 16, as shown in FIG. 11D.

This bonding process of the substrate 1 may be performed by the same process as that of the first embodiment.

The subsequent processes to the bonding process, i.e., the formation processes of the upper and lower electrodes, are the same as those in the first embodiment and therefore, the explanation for these processes is omitted here.

In the LED according to the fifth embodiment, the same method as that of the first embodiment may be used.

SIXTH EMBODIMENT

Figure 12:
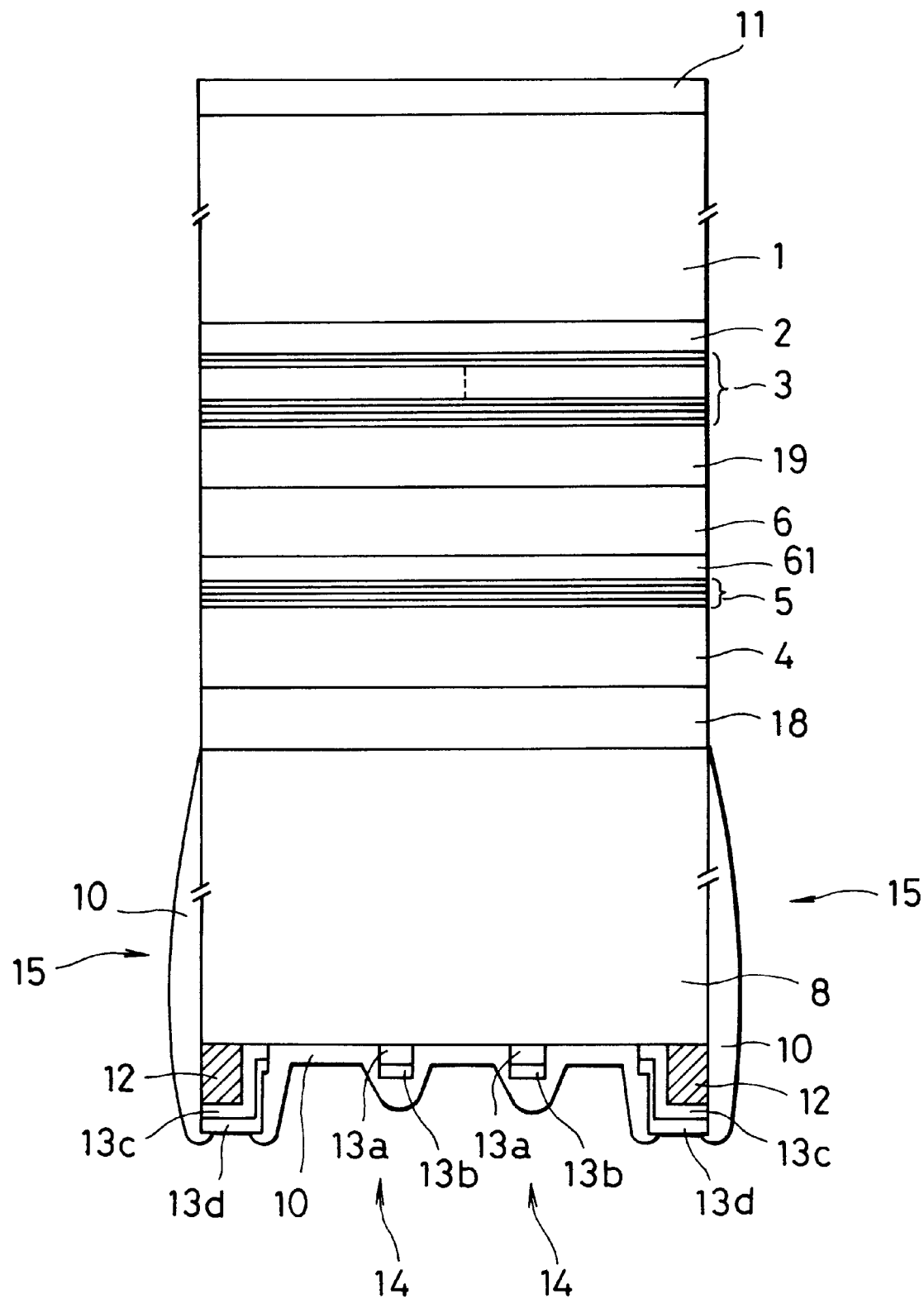
FIG. 12 is a vertical cross-sectional view of a surface-emitting semiconductor optical device according to a sixth embodiment.

FIG. 12 shows a surface-emitting visible LED according to a sixth embodiment, which correspond to one obtained by replacing the upper electrode structure with that of the second embodiment of FIG. 6 in the LED according to the fifth embodiment of FIG. 10.

Therefore, no explanation relating to the configuration is stated here by adding the same reference numerals to the corresponding elements in FIG. 12 for the sake of simplification.

APPLICATION

To apply an LED to a data linking system, the coupling efficiency with an optical fiber is important. Accordingly, the light-emitting surface of an LED needs to be designed so that the maximum coupling efficiency is realized.

The coupling efficiency is dependent upon several reasons such as the sort of an optical fiber, the light-emitting surface of an LED.

To accomplish the coupling efficiency of 50% or greater, the inventor found that the light-emitting surface is necessary to be designed in such a way that the ratio of the diameter of an optical fiber core with the light-emitting surface is 5 or larger.

For example, with a Step-Index (SI) type Plastic Optical Fiber (POF) having a core diameter of 0.98 mm and a NA of 0.5, the inventor found that the diameter of the light-emitting surface of the LED needs to be as small as approximately 200 μm for the purpose of the coupling efficiency over 70%. Therefore, in the surface-emitting visible LEDs according to the first to sixth embodiments, it is preferred that the surface-emitting surfaces 14 and 15 is designed to have a diameter of approximately 200 μm.

Figure 13:
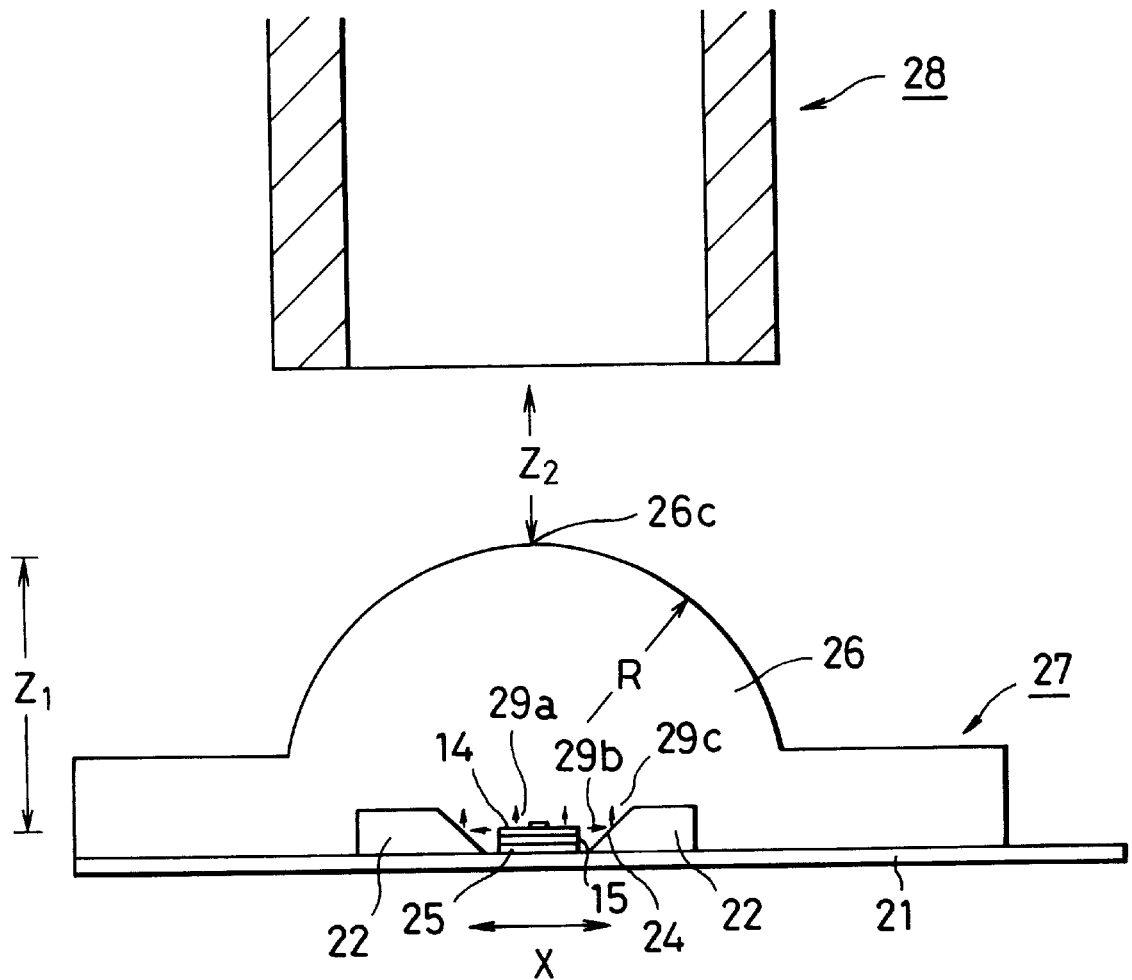
FIG. 13 is a schematic cross-sectional view showing a package structure of a surface-emitting semiconductor optical device according to the present invention, together with an optical fiber.

FIG. 13 shows a package structure of the LED according to the present invention used for a data-linking system.

In FIG. 13, a surface-emitting visible LED 25 according to any one of the first to sixth embodiments is fixed on a lead frame 21. Proper wiring with the upper and lower electrodes 13 (or, 13b and 13d) and 11 is performed. A circular or square ring-shaped mirror 22 is fixed on the lead frame 21 to surround the LED 25. The mirror 22 has a 45-degree reflection plane 24 inclined inwardly.

The LED 25, the mirror 22, and the lead frame 21 are molded by a plastic material, thereby forming a plastic package 27. The package 27 has a convex lens 26 located right over the LED 25. The lens 26 is formed by molding or casting. Here, the package 27 is formed by a proper plastic material to increase the coupling efficiency with an optical fiber 28 and to make the fabrication cost as low as possible.

The LED 25 has the light-emitting surfaces 14 and 15 on the top and side faces of the current spreading layer 8. Therefore, the emitted light will propagates along not only an arrow 29a perpendicular to the lead frame 21 but also an arrow 29b parallel to the lead frame 21. Then, the light beam emitted along the arrow 29b is reflected by the reflection plane 27 of the mirror 22, propagating along an arrow 29c parallel to the arrow 29a. Thus, the light emitted from the LED 25 is collected or gathered by the mirror 22 and is transmitted upward.

The collected light is then pass through the lens 26 to thereby focused toward the optical fiber 28 placed near the lens 26. Thus, all of the emitted light is able to be injected into the fiber 28.

When the fiber 28 is a Plastic Optical Fiber (POF), and the LED package 27 is designed for data-linking system, the inventor obtained the following data:

(a) The radius R of the lens 26 needs to be 0.6 mm or less.
(b) The distance from the top 26c of the lens 26 to the top of the LED 25 needs to be short at a length of approximately 0.75 mm.
(c) The molding material of the package 27 needs to have a refractive index of 1.60 or less.
(d) The molding process of the package 27 needs to be performed at a temperature of 200° C. or lower.
(e) When the fiber 28 is a Step-Index (SI) type POF having an NA of 0.5 and a core diameter of 0.98 mm, the obtainable coupling efficiency with the fiber 28 is 80% or higher.
(f) The position X of the LED 25 with respect to the top 26c of the lens 26, the distance $Z_1$ from the top of the LED 25 to the top 26c of the lens 26, and the distance $Z_2$ from the top 26c of the lens 26 to the end of the fiber 28 have important roles for the purpose of the enhanced coupling efficiency. The minimum values of the distances $Z_1$ and $Z_2$ are 0.7 mm and 0.3 mm, respectively.
(g) The NA of the emitted light from the LED 25 has an important role for the mode dispersion. When the NA is changed from 0.3 to 0.1, the bandwidth of the fiber 28 is increased from 300 MHz/km to 5 MHz/km. The NA is able to be readily changed by changing the distance from the LED 25 to the lens 26. The distance between the LED 25 and the lens 26 can be readily realized by mechanically polishing the bottom main surface of the substrate 1 serving as the optical absorption layer.
(h) The obtainable external quantum efficiency of the LED 25 is 30% or higher.
(i) The obtainable coupling efficiency with the fiber 28 is 80% or greater.

In the above-described first to sixth embodiments, the LED applicable to the POF-based optical communication systems is explained, where the Si-type POF is used as the fiber 28 in order to demonstrate the applications of the LED according to the present invention.

However, the LED according to the present invention can be applied any other optical system such as silica-based optical communication systems and outdoor display systems.

Further, the LEDs shown in the first to sixth embodiments may be used for the light with a wavelength of 0.5 to 1.6 μm.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A surface-emitting semiconductor optical device comprising:

(a) a multilayer device structure;
said device structure including an optical absorption layer formed by a semiconductor substrate, a semiconductor mirror layer, a first semiconductor cladding layer, a semiconductor active layer, a second semiconductor cladding layer, and a current spreading layer formed by a semiconductor wafer;
said absorption layer, said mirror layer, said first cladding layer, said active layer, said second cladding layer, and said current spreading layer are stacked along a stacking direction of said device structure;
said absorption layer being located at a first end of said body;
said active layer being sandwiched between said first and second cladding layers, and serving to generate light;
said mirror layer being located between said absorption layer and said first cladding layer, and serving to reflect said light generated by said active layer toward said current spreading layer;

said current spreading layer being located at a second end of said body opposite to said first end;

said current spreading layer being transparent with respect to said light generated by said active layer, and being doped with a dopant to decrease its electric resistance;

(b) a first electrode formed at said first end of said body and electrically connected to said absorption layer;

(c) a second electrode formed at said second end of said body and electrically connected to said current spreading layer; and (d) an exposed surface of the current spreading layer serving as a light-emitting surface;

wherein a driving current is injected into said multilayer device structure to flow through said absorption layer, said mirror layer, said first cladding layer, said active layer, said second cladding layer, and said current spreading layer along the stacking direction of said device structure;

and wherein said light generated by said active layer is emitted from said body through said light-emitting surface of said current spreading layer, further comprising a semiconductor protection layer for protecting said second cladding layer located between said second cladding layer and said current spreading layer.

2. A device as claimed in claim 1, further comprising a passivation layer provided to cover said light-emitting surface.

3. A device as claimed in claim 1, wherein said semiconductor wafer is made of a III–V compound semiconductor or a II–VI compound semiconductor.

* * * * *